(12) United States Patent
Michael et al.

(10) Patent No.: US 9,520,342 B2
(45) Date of Patent: Dec. 13, 2016

(54) POWER MANAGEMENT APPLICATIONS OF INTERCONNECT SUBSTRATES

(71) Applicant: Volterra Semiconductor Corporation, Fremont, CA (US)

(72) Inventors: Mihalis Michael, San Ramon, CA (US); Kwang Hong Tan, Singapore (SG); Ilija Jergovic, Palo Alto, CA (US); Chiteh Chiang, San Jose, CA (US); Anthony Stratakos, Oakland, CA (US)

(73) Assignee: Volterra Semiconductor Corporation, Fremont, CA (US)

( * ) Notice: Subject to any disclaimer, the term of this patent is extended or adjusted under 35 U.S.C. 154(b) by 40 days.

(21) Appl. No.: 14/753,305

(22) Filed: Jun. 29, 2015

(65) Prior Publication Data

US 2015/0303132 A1 Oct. 22, 2015

Related U.S. Application Data

(63) Continuation of application No. 13/644,693, filed on Oct. 4, 2012, now Pat. No. 9,099,340.

(Continued)

(51) Int. Cl.
*H05K 7/00* (2006.01)
*H01L 23/495* (2006.01)
(Continued)

(52) U.S. Cl.
CPC ......... *H01L 23/4952* (2013.01); *H01L 21/563* (2013.01); *H01L 23/3128* (2013.01); *H01L 23/3185* (2013.01); *H01L 23/36* (2013.01); *H01L 23/49527* (2013.01); *H01L 23/49568* (2013.01); *H01L 23/49575* (2013.01); *H01L 23/49838* (2013.01); *H01L 23/50* (2013.01); *H01L 23/5223* (2013.01); *H01L 23/5286* (2013.01); *H01L 24/05* (2013.01); *H01L 24/11* (2013.01); *H01L 24/13* (2013.01); *H01L 25/105* (2013.01); *H01L 23/3675* (2013.01); *H01L 23/49827* (2013.01); *H01L 24/03* (2013.01); *H01L 24/14* (2013.01); *H01L 24/81* (2013.01);

(Continued)

(58) Field of Classification Search
CPC .............. H01L 2924/01029; H01L 2224/0239; H01L 2224/05166; H01L 2224/05647; H01L 2924/00014; H01L 2924/01022; H01L 2224/02331; H01L 2224/05073; H01L 2224/131; H01L 2224/14131; H01L 2224/14177
USPC 361/760, 764, 767, 772, 781, 803; 174/260, 261; 257/737, 778
See application file for complete search history.

(56) References Cited

U.S. PATENT DOCUMENTS 5,859,474 A 1/1999 Dordi
5,952,726 A 9/1999 Liang
(Continued)

FOREIGN PATENT DOCUMENTS

WO 2013/052672 4/2013

OTHER PUBLICATIONS

U.S. Appl. No. 13/644,693, Notice of Allowance mailed Apr. 2, 2015.

(Continued)

*Primary Examiner* — Yuriy Semenenko
(74) *Attorney, Agent, or Firm* — Weaver Austin Villeneuve & Sampson LLP

(57) ABSTRACT

Various applications of interconnect substrates in power management systems are described.

19 Claims, 24 Drawing Sheets

Related U.S. Application Data

(60) Provisional application No. 61/544,945, filed on Oct. 7, 2011.

(51) Int. Cl.

| | | |
|---|---|---|
| *H01L 23/50* | (2006.01) | |
| *H01L 21/56* | (2006.01) | |
| *H01L 23/36* | (2006.01) | |
| *H01L 23/522* | (2006.01) | |
| *H01L 23/528* | (2006.01) | |
| *H01L 23/31* | (2006.01) | |
| *H01L 25/10* | (2006.01) | |
| *H01L 23/00* | (2006.01) | |
| *H01L 23/367* | (2006.01) | |
| *H01L 23/498* | (2006.01) | |

(52) U.S. Cl.
CPC ........ *H01L 24/83* (2013.01); *H01L 2224/0233* (2013.01); *H01L 2224/0239* (2013.01); *H01L 2224/02311* (2013.01); *H01L 2224/02313* (2013.01); *H01L 2224/02331* (2013.01); *H01L 2224/0345* (2013.01); *H01L 2224/0346* (2013.01); *H01L 2224/0347* (2013.01); *H01L 2224/0361* (2013.01); *H01L 2224/03912* (2013.01); *H01L 2224/0401* (2013.01); *H01L 2224/05073* (2013.01); *H01L 2224/05166* (2013.01); *H01L 2224/05548* (2013.01); *H01L 2224/05647* (2013.01); *H01L 2224/1146* (2013.01); *H01L 2224/1147* (2013.01); *H01L 2224/1191* (2013.01); *H01L 2224/131* (2013.01); *H01L 2224/1302* (2013.01); *H01L 2224/13024* (2013.01); *H01L 2224/13147* (2013.01); *H01L 2224/14131* (2013.01); *H01L 2224/14134* (2013.01); *H01L 2224/14177* (2013.01); *H01L 2224/16225* (2013.01); *H01L 2224/16227* (2013.01); *H01L 2224/16235* (2013.01); *H01L 2224/2919* (2013.01); *H01L 2224/32245* (2013.01); *H01L 2224/73204* (2013.01); *H01L 2224/81191* (2013.01); *H01L 2224/81815* (2013.01); *H01L 2224/8385* (2013.01); *H01L 2224/92125* (2013.01); *H01L 2225/1023* (2013.01); *H01L 2225/1058* (2013.01); *H01L 2924/16152* (2013.01); *H01L 2924/16196* (2013.01); *H01L 2924/181* (2013.01); *H01L 2924/381* (2013.01)

(56) References Cited

U.S. PATENT DOCUMENTS

| | | | |
|---|---|---|---|
| 6,075,710 A * | 6/2000 | Lau | 361/760 |
| 6,278,264 B1 * | 8/2001 | Burstein et al. | 323/282 |
| 6,713,823 B1 | 3/2004 | Nickel | |
| 7,795,071 B2 | 9/2010 | Hwee-Seng Jimmy et al. | |
| 7,989,953 B1 | 8/2011 | Jergovic et al. | |
| 8,085,553 B1 | 12/2011 | Lacap et al. | |
| 8,106,516 B1 | 1/2012 | Lacap et al. | |
| 8,169,081 B1 | 5/2012 | Jergovic et al. | |
| 8,350,375 B2 | 1/2013 | Ali et al. | |
| 9,099,340 B2 | 8/2015 | Michael et al. | |
| 2006/0090931 A1 * | 5/2006 | Hashimoto | 174/260 |
| 2007/0158859 A1 * | 7/2007 | Hierholzer | 257/784 |
| 2007/0216009 A1 * | 9/2007 | Ng | 257/690 |
| 2008/0173469 A1 | 7/2008 | Hirakawa | |
| 2009/0212424 A1 | 8/2009 | Chen | |
| 2010/0061056 A1 * | 3/2010 | Searls | H01L 21/563 361/679.56 |
| 2010/0224985 A1 * | 9/2010 | Michael et al. | 257/692 |
| 2013/0087366 A1 | 4/2013 | Michael et al. | |

OTHER PUBLICATIONS

WO patent application No. PCT/US2012/058762, International Search Report and Written Opinion, mailed Mar. 21, 2013.
WO patent application No. PCT/US2012/058762, Preliminary Report on Patentability and Written Opinion, mailed Apr. 8, 2014.

\* cited by examiner ated applica
POWER MANAGEMENT APPLICATIONS OF INTERCONNECT SUBSTRATES

RELATED APPLICATION DATA

The present application is a continuation of and claims priority under 35 U.S.C. 120 to U.S. patent application Ser. No. 13/644,693 for Power Management Applications of Interconnect Substrates filed on Oct. 4, 2012, which claims priority under 35 U.S.C. 119(e) to U.S. Provisional Patent Application No. 61/544,945 for Power Management Applications of Premolded Substrates filed on Oct. 7, 2011, the entire disclosures of both of which are incorporated herein by reference for all purposes.

BACKGROUND

The present application relates to the field of interconnect substrates and, more particularly, to the use of interconnect substrates in power management applications.

Semiconductor packaging technology known as Flip-Chip QFN (Quad flat no lead), involves mounting a flip-chip IC on a lead frame comprising conductive traces etched from a solid sheet of copper. This assembly is then encased in a molding compound to protect the device from the environment. A limitation with this "subtractive" approach to creating the conductive traces on which the flip-chip IC is mounted is that current etching techniques limit the density of the conductive traces. That is, the resolution of copper etching techniques places a lower bound on the distance between adjacent conductive traces (e.g., about 125 microns). This, in turn, limits the pitch of the connections (i.e., balls, bumps, or pillars) on the device, e.g., a flip-chip IC, to be mounted on the conductive traces. Some improvement can be achieved by reducing the thickness of the copper being etched, but this eventually results in unacceptable reliability issues such as, for example, fragility of the conductive traces and lead frame. Thus, conventional approaches to manufacturing conductive traces on a lead frame present significant obstacles to using such techniques with flip-chip and other packages having increasing numbers of I/O.

Techniques that employ organic substrates can achieve higher densities but are prohibitively expensive for many applications, and are often inferior for more extreme applications, or from a product life perspective.

SUMMARY OF THE INVENTION

Interconnect substrates for use in power management applications are described.

According to a particular class of implementations, an interconnect substrate is provided for connecting a device to an assembly, the device being characterized by a device pitch and the assembly being characterized by an assembly pitch that is less than about 800 microns. The interconnect substrate includes a plurality of electrically conductive structures, each of the electrically conductive structures being configured for connection to a corresponding one of a plurality of circuit nodes of the device. The electrically conductive structures corresponding to at least one of the circuit nodes of the device are arranged in an alternating pattern in the interconnect substrate with the electrically conductive structures corresponding to at least one other of the circuit nodes. The device pitch is about half the assembly pitch, and a width of at least some of the electrically conductive structures is at least about two times a spacing between the at least some of the electrically conductive structures.

Various of these implementations may include any of the following features, including any suitable combinations, permutations, or subsets thereof:

At least some of the circuit nodes of the device correspond to terminals of one or more power devices; the one or more power devices are part of a switching regulator; the one or more power devices include two power devices, and the terminals include two power node terminals and a switching terminal; the electrically conductive structures corresponding to the power node terminals and the switching terminal are configured for connection to corresponding conductive structures of the assembly.

The interconnect substrate has a first surface for connecting to the device and a second surface for connecting to the assembly, and an edge, particular ones of the electrically conductive structures not reaching the edge of the interconnect substrate; the particular electrically conductive structures that do not reach the edge of the interconnect substrate are configured to connect a corresponding circuit node of the device to a corresponding conductive structure of the assembly, at least a portion of which lies directly under the device; a majority of the electrically conductive structures of the interconnect substrate lie directly under the device.

The interconnect substrate has a first surface for connecting to the device and a second surface for connecting to the assembly, and an edge, particular ones of the electrically conductive structures extending at least to the edge of the interconnect substrate.

At least some of the electrically conductive structures have a length and a width, and the length is at least four times the width.

At least some of the electrically conductive structures each have one or more studs thereon configured for connection to a conductive structure of the assembly; the studs are configured to accept solder; the studs include plated solder or pre-formed solder; at least some of the studs are circular, and there are multiple circular studs on at least some of the electrically conductive structures; at least some of the circular studs includes solder balls; at least some of the studs include elongated studs.

The electrically conductive structures corresponding to a first one of the circuit nodes of the device extend in a first direction in a primary planar orientation of the interconnect substrate, and the electrically conductive structures corresponding to the first circuit node of the device are connected to each other in the interconnect substrate by a common conductive structure extending in a second direction, the second direction not being parallel to the first direction in the primary planar orientation of the interconnect substrate; the interconnect substrate has a first surface for connecting to the device and a second surface for connecting to the assembly, and an edge, and the electrically conductive structures corresponding to the first circuit node and the common conductive structure do not reach the edge of the interconnect substrate; the interconnect substrate has a first surface for connecting to the device and a second surface for connecting to the assembly, and an edge, and the common conductive structure is disposed near a portion of the edge of the interconnect substrate thereby allowing for connection of the electrically conductive structures corresponding to the first circuit node of the device to a single conductive structure of the assembly; the interconnect substrate has a first surface for connecting to the device and a second surface for connecting to the assembly, and an edge, and the common conductive structure is disposed near a first portion of the edge of the interconnect substrate, the interconnect substrate further including a second common conductive structure connecting in the interconnect substrate the electrically conductive structures corresponding to a second one of the circuit nodes of the device, and the second common conductive structure is disposed near a second portion of the edge of the interconnect substrate.

The electrically conductive structures corresponding to two or more of the circuit nodes are disposed in a first region of the interconnect substrate characterized by a first width-to-spacing ratio of conductive material, and the electrically conductive structures corresponding to two or more others of the circuit nodes are disposed in a second region of the interconnect substrate characterized by a second width-to-spacing ratio of the conductive material that is different from the first width-to-spacing ratio; the device includes at least a portion of a switching regulator, and the electrically conductive structures disposed in the first region of the interconnect substrate correspond to power stage nodes of a power stage of the switching regulator, and the electrically conductive structures disposed in the second region of the interconnect substrate correspond to control circuit nodes of control circuitry of the switching regulator.

The device includes one or more power devices and associated control circuitry, and first ones of the electrically conductive structures correspond to terminals of the one or more power devices, and second ones of the electrically conductive structures correspond to control circuit nodes of the control circuitry; the one or more power devices and the associated control circuitry are part of a switching regulator.

The interconnect substrate has a first surface for connecting to the device, portions of at least some of the electrically conductive structures being exposed on the first surface of the interconnect substrate, the interconnect substrate further including a plurality of conductive bumps formed on the exposed portions of the electrically conductive structures and configured for connection with the device; the conductive bumps include any of balls, bumps, pillars, or studs; the conductive bumps include copper pillars formed directly on the electrically conductive structures; the conductive bumps include copper pillars, and the copper pillars are formed on an under-bump metallization (UBM) layer formed on the electrically conductive structures; the conductive bumps include copper pillars, and the copper pillars reduce the lateral conductivity of the electrically conductive structures.

The interconnect substrate has a first surface for connecting to the device, portions of at least some of the electrically conductive structures being exposed on the first surface of the interconnect substrate and configured for connection to conductive bumps formed on the device; the conductive bumps include any of balls, bumps, pillars, or studs.

A thermally conductive structure configured for conducting heat from the device; at least a portion of the thermally conductive structure extends through the interconnect substrate thereby enabling conduction of the heat from the device to the assembly.

At least some of the electrically conductive structures are configured for mounting of discrete passive circuit elements on the interconnect substrate.

At least some of the electrically conductive structures include structural features that promote adhesion with an intervening medium of the interconnect substrate, and the structural features include one or more of wavy edges, jagged edges, zig-zag edges, irregular edges, edge perforations, or edge protrusions.

The electrically conductive structures arranged in the alternating pattern include elongated structures corresponding to first and second circuit nodes, respectively, the elongated structures being oriented in a first direction in the interconnect substrate, with the elongated structures corresponding to the first circuit node alternating with the elongated structures corresponding to the second circuit node; each of the electrically conductive structures arranged in the alternating pattern has a length that is at least four times its width, each of the electrically conductive structures corresponding to the first circuit node has one or more studs thereon at an end of the electrically conductive structure near a first edge of the interconnect substrate, and each of the electrically conductive structures corresponding to the second circuit node has one or more studs thereon at an end of the electrically conductive structure near a second edge of the interconnect substrate opposite the first edge, and the studs on the electrically conductive structures corresponding to the first circuit node are configured for connection to a first conductive plane on the assembly, and the studs on the electrically conductive structures corresponding to the second circuit node are configured for connection to a second conductive plane on the assembly, the first and second conductive planes being adjacent and non-overlapping.

According to another class of implementations, an interconnect substrate is provided for connecting a device to an assembly. The interconnect substrate includes a plurality of electrically conductive structures, each of the electrically conductive structures being configured for connection to a corresponding one of a plurality of circuit nodes of the device. One or more of the electrically conductive structures corresponding to a first circuit node of the device is enclosed in the interconnect substrate by one or more of the electrically conductive structures corresponding to a second circuit node of the device.

Various of these implementations may include any of the following features, including any suitable combinations, permutations, or subsets thereof:

At least some of the circuit nodes of the device correspond to terminals of one or more power devices; the one or more power devices are part of a switching regulator; the one or more power devices include two power devices, and the terminals include two power node terminals and a switching terminal; one of the power node terminals includes the first circuit node of the device, and the switching terminal includes the second circuit node of the device; the one or more electrically conductive structures corresponding to the first circuit node, and the one or more of the electrically conductive structures corresponding to the second circuit node are configured for connection to corresponding conductive structures of the assembly.

The one or more electrically conductive structures corresponding to the first circuit node includes a plurality of the electrically conductive structures, and the one or more electrically conductive structures corresponding to the second circuit node of the device includes a first conductive planar structure having a plurality of apertures therein in which the electrically conductive structures corresponding to the first circuit node of the device are enclosed; the apertures enclosing the electrically conductive structures corresponding to the first circuit node form a checkerboard pattern in the first conductive planar structure; the electrically conductive structures corresponding to the first circuit node and the first conductive planar structure are configured to connect with the first and second circuit nodes of the device, respectively, on one side of the interconnect substrate via a plurality of conductive bumps, and the electrically conductive structures corresponding to the first circuit node and the first conductive planar structure are further configured to connect with first and second assembly conductive planar structures of the assembly, respectively, on an opposing side of the interconnect substrate; the first and second assembly conductive planar structures are adjacent and non-overlapping; the first conductive planar structure is configured to connect with the second assembly conductive planar structure at an edge of the first conductive planar structure, and the electrically conductive structures corresponding to the first circuit node are configured to connect to the first assembly conductive planar structure at locations in a direction substantially perpendicular to a primary planar orientation of the interconnect substrate; each of a plurality of the electrically conductive structures corresponding to a third circuit node is also enclosed in the interconnect substrate within a corresponding one of the apertures of the first conductive planar structure.

The device includes at least a portion of a switching regulator, and first ones of the electrically conductive structures disposed in a first region of the interconnect substrate correspond to power stage nodes of a power stage of the switching regulator, and second ones of the electrically conductive structures disposed in a second region of the interconnect substrate correspond to control circuit nodes of control circuitry of the switching regulator.

The interconnect substrate has a first surface for connecting to the device, portions of at least some of the electrically conductive structures being exposed on the first surface of the interconnect substrate, the interconnect substrate further including a plurality of conductive bumps formed on the exposed portions of the electrically conductive structures and configured for connection with the device; the conductive bumps include any of balls, bumps, pillars, or studs; the conductive bumps include copper pillars formed directly on the electrically conductive structures; the conductive bumps include copper pillars, and the copper pillars are formed on an under-bump metallization (UBM) layer formed on the electrically conductive structures.

The interconnect substrate has a first surface for connecting to the device, portions of at least some of the electrically conductive structures being exposed on the first surface of the interconnect substrate and configured for connection to conductive bumps formed on the device; the conductive bumps include any of balls, bumps, pillars, or studs.

A thermally conductive structure configured for conducting heat from the device; at least a portion of the thermally conductive structure extends through the interconnect substrate thereby enabling conduction of the heat from the device to the assembly.

At least some of the electrically conductive structures are configured for mounting of discrete passive circuit elements on the interconnect substrate.

At least some of the electrically conductive structures include structural features that promote adhesion with an intervening medium of the interconnect substrate, and the structural features include one or more of wavy edges, jagged edges, zig-zag edges, irregular edges, edge perforations, or edge protrusions.

According to another class of implementations, a package is provided that includes a device including one or more power devices, and an interconnect substrate for connecting the device to an assembly. The interconnect substrate includes a plurality of electrically conductive structures, first ones of the electrically conductive structures corresponding to terminals of the one or more power devices. The device is mounted on exposed portions of the electrically conductive structures of the interconnect substrate via conductive bumps.

Various of these implementations may include any of the following features, including any suitable combinations, permutations, or subsets thereof:

The one or more power devices are part of a switching regulator.

The one or more power devices include two power devices, and the terminals include two power node terminals and a switching terminal.

At least one of the first electrically conductive structures corresponding to one of the terminals is enclosed in the interconnect substrate by at least one other of the first electrically conductive structures corresponding to another one of the terminals.

The device includes control circuitry associated with the one or more power devices, and second ones of the electrically conductive structures correspond to control circuit nodes of the control circuitry.

At least some of the electrically conductive structures of the interconnect substrate have discrete passive circuit elements connected thereto; the discrete passive circuit elements include a plurality of capacitors connected to at least some of the terminals of the one or more power devices; a first terminal of the one or more power devices has two or more of the plurality of capacitors connected thereto, the two or more capacitors being mounted on the interconnect substrate along more than one edge of the device; the first electrically conductive structures corresponding to a first terminal of the one or more power devices are configured for connection to the assembly along a first edge of the interconnect substrate, and one or more of the capacitors corresponding to the first terminal are mounted along a second edge of the interconnect substrate different from the first edge; the electrically conductive structures to which a first one of the discrete passive elements is connected are not configured for connection to the assembly; the first discrete passive circuit element is only accessible for testing using a test interface of the device; one or more of the discrete passive circuit elements are mounted on the interconnect substrate between adjacent ones of the conductive bumps; the discrete passive circuit elements include one or more of a capacitor, a resistor, or an inductor.

An underfill material occupying space between the conductive bumps connecting the electrically conductive structures of the interconnect substrate to the device; the underfill material includes either a dispensed underfill or a molded underfill; the underfill material is part of an encapsulation material at least partially encapsulating the device.

The device is mounted on the electrically conductive structures of the interconnect substrate on a first side of the device, and a second side of the device opposing the first side is exposed for heat removal; the interconnect substrate further includes a thermally conductive structure, the package further including a heat spreader structure mounted on the exposed second side of the device and thermally connected to the thermally conductive structure of the interconnect substrate to promote heat conduction from the device to the thermally conductive structure; at least a portion of the thermally conductive structure extends through the interconnect substrate and is configured for connection to the assembly, thereby enabling conduction of the heat from the device to the assembly; one or more portions of a carrier frame disposed along one or more edges of the interconnect substrate adjacent the device, the heat spreader structure being thermally connected to the thermally conductive structure of the interconnect substrate via the portions of the carrier frame; the carrier frame is rectangular and continuous around the device on the interconnect substrate; the carrier frame includes one or more discontinuous segments around the device on the interconnect substrate; the heat spreader structure includes a plurality of disconnected or partially connected portions, and/or one or more apertures.

The package of further includes a second device and a second interconnect substrate for connecting the second device to the assembly via the interconnect substrate, the second interconnect substrate including a second plurality of electrically conductive structures, and the second device is mounted on exposed portions of the second plurality of electrically conductive structures via second conductive bumps, and the second interconnect substrate is mounted on the device with at least some of the second plurality of electrically conductive structures being connected to one or more of the plurality of electrically conductive structures of the interconnect substrate via third conductive bumps adjacent an edge of the device; the second device also includes one or more power devices.

The first electrically conductive structures corresponding to at least one of the terminals of the one or more power devices are arranged in an alternating pattern in the interconnect substrate with the first electrically conductive structures corresponding to least one other of the terminals of the one or more power devices.

The device is characterized by a device pitch and the assembly is characterized by an assembly pitch that is less than about 800 microns, and the device pitch is about half the assembly pitch, and a width of at least some of the electrically conductive structures is at least about 2 times a spacing between the at least some of the electrically conductive structures.

The interconnect substrate has a first surface connected to the device and a second surface connected to the assembly, and an edge, at least some of the electrically conductive structures not reaching the edge of the interconnect substrate.

The interconnect substrate has a first surface connected to the device and a second surface connected to the assembly, and an edge, at least some of the electrically conductive structures extending at least to the edge of the interconnect substrate.

At least some of the electrically conductive structures have a length and a width, and the length is at least four times the width.

At least some of the electrically conductive structures each have one or more studs thereon configured for connection to a conductive structure of the assembly; the studs are configured to accept solder; the studs include plated solder or pre-formed solder; at least some of the studs are circular, and there are multiple circular studs on at least some of the electrically conductive structures; at least some of the circular studs includes solder balls; at least some of the studs include elongated studs.

The first electrically conductive structures corresponding to a first one of the terminals extend in a first direction in a primary planar orientation of the interconnect substrate, and the first electrically conductive structures corresponding to the first terminal are connected to each other in the interconnect substrate by a common conductive structure extending in a second direction, the second direction not being parallel to the first direction in the primary planar orientation of the interconnect substrate; the interconnect substrate has a first surface for connecting to the device and a second surface for connecting to the assembly, and an edge, and the first electrically conductive structures corresponding to the first terminal and the common conductive structure do not reach the edge of the interconnect substrate; the interconnect substrate has a first surface connected to the device and a second surface connected to the assembly, and an edge, and the common conductive structure is disposed near a portion of the edge of the interconnect substrate and configured for connecting the first electrically conductive structures corresponding to the first terminal to a single conductive structure of the assembly; the interconnect substrate has a first surface connected to the device and a second surface connected to the assembly, and an edge, and the common conductive structure is disposed near a first portion of the edge of the interconnect substrate, the interconnect substrate further including a second common conductive structure connecting in the interconnect substrate the first electrically conductive structures corresponding to a second one of the terminals, and the second common conductive structure is disposed near a second portion of the edge of the interconnect substrate.

The first electrically conductive structures corresponding to the terminals of the one or more power devices are disposed in a first region of the interconnect substrate characterized by a first width-to-spacing ratio of conductive material, and second ones of the electrically conductive structures corresponding to control circuit nodes of control circuitry associated with the one or more power devices are disposed in a second region of the interconnect substrate characterized by a second width-to-spacing ratio of the conductive material that is different from the first width-to-spacing ratio.

A thermally conductive structure configured for conducting heat from the device; at least a portion of the thermally conductive structure extends through the interconnect substrate and is configured for connection to the assembly, thereby enabling conduction of the heat from the device to the assembly.

At least some of the electrically conductive structures include structural features that promote adhesion with an intervening medium of the interconnect substrate, and the structural features include one or more of wavy edges, jagged edges, zig-zag edges, irregular edges, edge perforations, or edge protrusions.

At least one of the first electrically conductive structures corresponding to a first terminal of the one or more power devices is enclosed in the interconnect substrate by one or more of the first electrically conductive structures corresponding to a second terminal of the one or more power devices; the one or more of the first electrically conductive structures corresponding to the second terminal includes a first conductive planar structure having a plurality of apertures therein in which the first electrically conductive structures corresponding to the first terminal are enclosed; the apertures enclosing the first electrically conductive structures corresponding to the first terminal form a checkerboard pattern in the first conductive planar structure; the first electrically conductive structures corresponding to the first terminal and the first conductive planar structure are configured to connect with the first and second terminals, respectively, on one side of the interconnect substrate via a subset of the conductive bumps, and the first electrically conductive structures corresponding to the first terminal and the first conductive planar structure are further configured to connect with first and second assembly conductive planar structures, respectively, on an opposing side of the interconnect substrate; at least some of the first electrically conductive structures include vias that enable current or heat conduction in a direction perpendicular to a primary planar orientation of the interconnect substrate to assembly structures directly under the device; the first and second assembly conductive planar structures are adjacent and non-overlapping; the first conductive planar structure is configured to connect with the second assembly conductive planar structure at an edge of the first conductive planar structure, and the first electrically conductive structures corresponding to the first terminal are configured to connect to the first assembly conductive planar structure at locations in a direction substantially perpendicular to a primary planar orientation of the interconnect substrate; each of a plurality of the first electrically conductive structures corresponding to a third terminal of the one or more power devices is also enclosed in the interconnect substrate within a corresponding one of the apertures of the first conductive planar structure.

The conductive bumps include any of balls, bumps, pillars, or studs; the conductive bumps include copper pillars; the copper pillars are formed directly on the electrically conductive structures of the interconnect substrate; the copper pillars are formed on an under-bump metallization (UBM) layer formed on the electrically conductive structures of the interconnect substrate; the device includes a copper redistribution layer (RDL) and the copper pillars are formed directly on the RDL; the device includes a copper redistribution layer (RDL), and the copper pillars are formed on an under-bump metallization (UBM) layer formed on the RDL.

According to another class of implementations, an interconnect substrate is provided for connecting a device to an assembly, including a plurality of electrically conductive structures. Each of the electrically conductive structures is configured for connection to a corresponding one of a plurality of circuit nodes of the device. At least some of the electrically conductive structures of the interconnect substrate have discrete passive circuit elements that are mounted on the interconnect substrate connected thereto. At least one of the electrically conductive structures to which a terminal of a first one of the discrete passive elements is connected is configured only for connection to the device and not to the assembly.

Various of these implementations may include any of the following features, including any suitable combinations, permutations, or subsets thereof Two or more of the discrete passive circuit elements are configured for connection to a first circuit node of the device, the two or more discrete passive circuit elements being mounted along more than one edge of the interconnect substrate.

The electrically conductive structures corresponding to a first circuit node of the device are configured for connection to the assembly along a first edge of the interconnect substrate, and one or more of the discrete passive circuit elements corresponding to the first circuit node are mounted on a second edge of the interconnect substrate different from the first edge.

One or more of the discrete passive circuit elements are mounted on the interconnect substrate at locations between exposed portions of the electrically conductive structures of the interconnect substrate configured for connection to the device.

The discrete passive circuit elements include one or more of a capacitor, a resistor, or an inductor.

The device includes one or more power devices, at least some of the electrically conductive structures corresponding to terminals of the one or more power devices, and the discrete passive circuit elements include a plurality of capacitors configured for connection to at least some of the terminals of the one or more power devices.

The first discrete passive circuit element and the corresponding electrically conductive structures are configured such that, when the device, the interconnect substrate and the assembly are connected, the first discrete passive circuit element is only accessible for testing using a test interface of the device.

According to another class of implementations, an interconnect substrate is provided for connecting a device to an assembly, including a plurality of electrically conductive structures. Each of the electrically conductive structures is configured for connection to a corresponding one of a plurality of circuit nodes of the device. At least some of the electrically conductive structures of the interconnect substrate have discrete passive circuit elements that are mounted on the interconnect substrate connected thereto. Two or more of the discrete passive circuit elements are configured for connection to a first circuit node of the device. The two or more discrete passive circuit elements are mounted along more than one of edge of the interconnect substrate.

Various of these implementations may include any of the following features, including any suitable combinations, permutations, or subsets thereof:

The electrically conductive structures corresponding to the first circuit node of the device are configured for connection to the assembly along a first edge of the interconnect substrate, the first edge being different than at least one of the edges along which the two or more discrete passive circuit elements are mounted.

One or more of the discrete passive circuit elements are mounted on the interconnect substrate at locations between exposed portions of the electrically conductive structures of the interconnect substrate configured for connection to the device.

The discrete passive circuit elements include one or more of a capacitor, a resistor, or an inductor.

The device includes one or more power devices, at least some of the electrically conductive structures corresponding to terminals of the one or more power devices, and the discrete passive circuit elements include a plurality of capacitors configured for connection to at least some of the terminals of the one or more power devices.

According to another class of implementations, an interconnect substrate is provided for connecting a device to an assembly, including a plurality of electrically conductive structures. Each of the electrically conductive structures is configured for connection to a corresponding one of a plurality of circuit nodes of the device. At least some of the electrically conductive structures of the interconnect substrate have discrete passive circuit elements that are mounted on the interconnect substrate connected thereto. The electrically conductive structures corresponding to a first circuit node of the device are configured for connection to the assembly along a first edge of the interconnect substrate, and one or more of the discrete passive circuit elements corresponding to the first circuit node are mounted on a second edge of the interconnect substrate different from the first edge.

Various of these implementations may include any of the following features, including any suitable combinations, permutations, or subsets thereof:

Two or more of the discrete passive circuit elements are configured for connection to the first circuit node of the device, the two or more discrete passive circuit elements being mounted along more than one edge of the interconnect substrate.

One or more of the discrete passive circuit elements are mounted on the interconnect substrate at locations between exposed portions of the electrically conductive structures of the interconnect substrate configured for connection to the device.

The discrete passive circuit elements include one or more of a capacitor, a resistor, or an inductor.

The device includes one or more power devices, at least some of the electrically conductive structures corresponding to terminals of the one or more power devices, and the discrete passive circuit elements include a plurality of capacitors configured for connection to at least some of the terminals of the one or more power devices.

According to another class of implementations, a bumped device is provided that includes a plurality of conductive structures including a redistribution layer (RDL), and a plurality of copper pillars formed directly on the RDL without passivating material between the copper pillars and the RDL.

Various of these implementations may include any of the following features, including any suitable combinations, permutations, or subsets thereof:

A passivating layer covering the RDL through which the copper pillars extend.

The copper pillars reduce the lateral conductivity of the electrically conductive structures.

The device includes an integrated circuit.

The bumped device includes one or more power devices having a plurality of terminals; the one or more power devices are part of a switching regulator; the one or more power devices include two power devices, and the terminals include two power node terminals and a switching terminal; the copper pillars are configured to connect the terminals of the one or more power devices to electrically conductive structures of a substrate.

According to another class of implementations, a method for fabricating a device is provided. A seed layer is sputtered over an accessible metallization of an underlying substrate. A first photoresist layer having a first pattern is placed over the seed layer. A first conductive metal layer is plated using the seed layer according to the first pattern. A second photoresist having a second pattern is placed over the first conductive metal layer. A second conductive metal layer is plated using the seed layer according to the second pattern. The second conductive metal layer is formed without passivating material between the second conductive metal layer and the first conductive metal layer. The seed layer is etched.

Various of these implementations may include any of the following features, including any suitable combinations, permutations, or subsets thereof:

The first and second conductive metal layers include copper.

The first conductive metal layer includes a copper redistribution layer (RDL) and the second conductive metal layer includes a plurality of copper pillars; a passivating material is deposited over the RDL and copper pillars; solder is plated on the copper pillars.

One or more additional conductive metal layers are plated using the seed layer.

The first photoresist layer is stripped before applying the second photoresist layer.

The first and second photoresist layers are stripped substantially simultaneously.

According to another class of implementations, an interconnect substrate is provided for connecting a device to an assembly. The device includes a power stage of a switching regulator. The power stage has first and second power node terminals and a switching terminal. The interconnect substrate includes a plurality of electrically conductive structures, first ones of the electrically conductive structures being configured for connection to the first power node terminal, second ones of the electrically conductive structures being configured for connection to the switching terminal, and third ones of the electrically conductive structures being configured for connection to the second power node terminal. The first, second, and third electrically conductive structures are arranged in the interconnect substrate such that current in the second electrically conductive structures resulting from operation of the power stage of the switching regulator remains substantially constant when conduction is commutated between the first electrically conductive structures and the third electrically conductive structures.

Various of these implementations may include any of the following features, including any suitable combinations, permutations, or subsets thereof:

Each of the second electrically conductive structures is adjacent one of the first electrically conductive structures and one of the third electrically conductive structures; each of the second electrically conductive structures has one of the first electrically conductive structures on a first side of the second electrically conductive structure and one of the third electrically conductive structures on an opposing side of the second electrically conductive structure opposite the first side.

According to another class of implementations, a package is provide that includes, including a device including a power stage of a switching voltage regulator, the power stage having first and second power node terminals and a switching terminal. The package also includes an interconnect substrate for connecting the device to an assembly. The interconnect substrate includes a plurality of electrically conductive structures, first ones of the electrically conductive structures being connected to the first power node terminal, second ones of the electrically conductive structures being connected to the switching terminal, and third ones of the electrically conductive structures being connected to the second power node terminal. The first, second, and third electrically conductive structures are arranged in the interconnect substrate such that current in the second electrically conductive structures resulting from operation of the power stage of the switching regulator remains substantially constant when conduction is commutated between the first electrically conductive structures and the third electrically conductive structures.

Various of these implementations may include any of the following features, including any suitable combinations, permutations, or subsets thereof:

Each of the second electrically conductive structures is adjacent one of the first electrically conductive structures and one of the third electrically conductive structures; each of the second electrically conductive structures has one of the first electrically conductive structures on a first side of the second electrically conductive structure and one of the third electrically conductive structures on an opposing side of the second electrically conductive structure opposite the first side.

According to another class of implementations, a bumped device is provides that includes a power stage of a switching voltage regulator, the power stage having first and second power node terminals and a switching terminal. The bumped device also includes a plurality of conductive bumps arranged on a surface thereof and configured for facilitating external connections to the first and second power node terminals and the switching terminal of the power stage of the switching voltage regulator. First ones of the conductive bumps are electrically connected to the first power node terminal, second ones of the conductive bumps are electrically connected to the switching terminal, and third ones of the conductive bumps are electrically connected to the second power node terminal. The power stage of the switching regulator is configured and the first, second, and third conductive bumps are arranged such that current in the second conductive bumps resulting from operation of the power stage of the switching regulator remains substantially constant when conduction is commutated between the first conductive bumps and the third conductive bumps.

Various of these implementations may include any of the following features, including any suitable combinations, permutations, or subsets thereof:

Each of a plurality of subsets of the second conductive bumps is adjacent one of a plurality of subsets of the first conductive bumps and one of a plurality of subsets of the third conductive bumps; each of the plurality of subsets of the first, second, and third conductive bumps is arranged in a row, each row of the second conductive bumps having a row of the first conductive bumps on a first side of the row of second conductive bumps, and a row of the third conductive bumps on an opposing side of the row of the second conductive bumps opposite the first side.

The conductive bumps include any of balls, bumps, pillars, or studs.

The conductive bumps include copper pillars; the bumped device includes a copper redistribution layer (RDL) and the copper pillars are formed directly on the RDL; the bumped device includes a copper redistribution layer (RDL), and the copper pillars are formed on an under-bump metallization (UBM) layer formed on the RDL.

The conductive bumps are elongated.

A further understanding of the nature and advantages of the present invention may be realized by reference to the remaining portions of the specification and the drawings.

DETAILED DESCRIPTION OF SPECIFIC EMBODIMENTS

Figure 1:
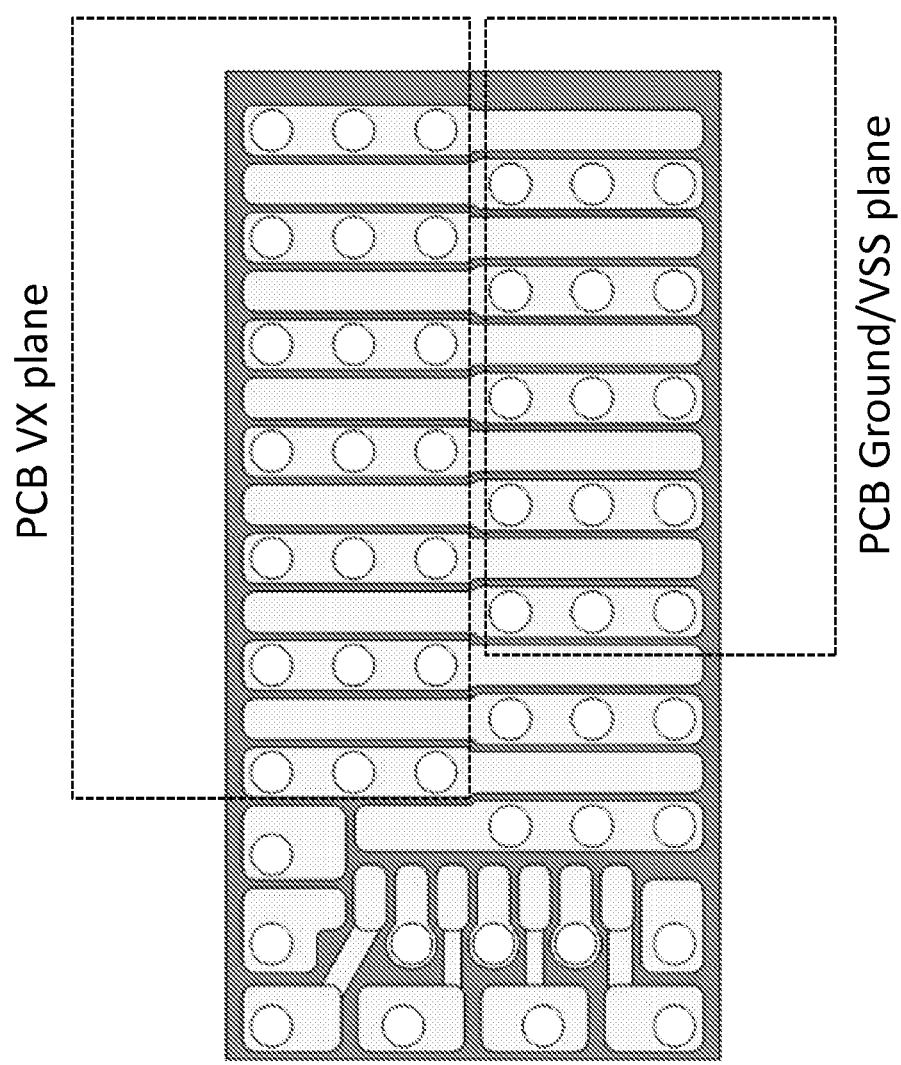
FIG. 1 illustrates a particular implementation of an interconnect substrate.

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

Semiconductor packaging technology known as Flip-Chip QFN (Quad flat no lead), involves mounting a flip-chip IC on a lead frame comprising conductive traces etched from a solid sheet of copper. This assembly is then encased in a molding compound to protect the device from the environment. A limitation with this "subtractive" approach to creating the conductive traces on which the flip-chip IC is mounted is that current etching techniques limit the density of the conductive traces. That is, the resolution of copper etching techniques places a lower bound on the distance between adjacent conductive traces (e.g., about 125 microns). This, in turn, limits the pitch of the connections (i.e., balls, bumps, or pillars) on the device, e.g., a flip-chip IC, to be mounted on the conductive traces. Some improvement can be achieved by reducing the thickness of the copper being etched, but this eventually results in unacceptable reliability issues such as, for example, fragility of the conductive traces and lead frame. Thus, conventional approaches to manufacturing conductive traces on a lead frame present significant obstacles to using such techniques with flip-chip and other packages having increasing numbers of I/O.

Techniques that employ organic substrates can achieve higher densities but are prohibitively expensive for many applications, and are often inferior for more extreme applications, or from a product life perspective.

Premolded substrates in which conductive traces are manufactured using "additive" techniques (e.g., plating up the conductive traces on a substrate) may achieve suitably high densities in some applications (e.g., about 40-50 microns between conductive traces and potentially as low as 30 microns in some cases).

Various premolded substrates described herein may be characterized by a first set of benefits derived from advantages of plating technology relative to etching technology, and/or a second set of benefits derived from advantages of premolded structures relative to conventional lead frames.

With regard to plating vs. etching, etched traces have limitations relative to plated traces in terms of the trace aspect ratio that is achievable. For example, when etching from two sides of a sheet of copper, conventional processes can typically only achieve a spacing between traces of slightly more than half the thickness of the traces. By contrast, plating is regularly seen to produce much higher aspect ratio structures. There are ways to achieve similar spacing using etching but they require etching only a thin layer. Thus, one advantage of plating relative to etching is higher aspect ratio structures (e.g., 110 um trace thickness with 40 um spacing between traces).

In addition, premolded substrates (which can be created with both etching and plating techniques) have an advantage relative to conventional lead frames in that an actual frame for the conductive traces is not required for premolded substrates. That is, with conventional lead frames, the intermediate etched traces must be connected to a frame that keeps the structure together until molding. This imposes the requirement that all traces reach to the edge of the device, i.e., no floating structures internal to the device can be created. This makes it difficult to create area array and multi-row packages as there is no way to have internal floating conductive structures that do not reach the edge of the device. Because premolded substrates do not require such a frame, they are not limited in this way.

As will become apparent with reference to the description of specific embodiments below, a variety of advantages may be achieved with premolded substrates implemented as described herein. For example, a conventional lead frame fabricated using etching with 200 um thickness typically yields conductive traces that are 250 um wide with a 400 um pitch. By comparison and in accordance with one or more embodiments described herein, for the same conductive trace width, a 290 um pitch may be achieved in premolded substrates using plating; a reduction of 110 um. If one were to attempt to reduce the width of the conductive traces of a conventional lead frame below 250 um, the etching process would result in structures that are not mechanically stable. For example, if such structures are created in half etch, they would form cantilever bridges that are limited with respect to how far they can extend. While trace width in etched lead frames can theoretically be reduced to 125 um (thereby achieving a 275 um pitch with 150 um spacing), such structures are severely restricted in length. By comparison, the conductive traces of a premolded substrate are supported by the molding compound in which they are suspended and can travel great distances, e.g., more than 4× their width.

In addition, while the pitch on some devices (e.g., flip-chip devices) can be very low (e.g., 150 um), the pitch on printed circuit boards (PCBs) is generally 500 um (with limited applications having a 400 um pitch). In general, the current state of the art for PCB and via technology does not permit the reduction of pitch below 500 um without a prohibitive increase in cost (for most applications). This is due to the fact that PCBs are typically manufactured using etching technologies (with some additive plating for vias and outer layers). Thus, because of this limitation of PCBs, external device pitch needs to remain at 500 um while internal device pitch needs to be fanned in to any reduced pitch. Unfortunately, conventional lead frame technology puts practical limits on internal device pitch that cannot effectively match the very low pitches and high I/O counts by which some device technologies, e.g., flip-chip devices, are characterized. Various embodiments are described below which illustrate one or more of the advantages of premolded substrates with respect to these design issues.

According to some embodiments, premolded substrates may be manufactured as follows. A carrier substrate or carrier frame (e.g., steel may be used as a low cost option) is pre-plated with a thin film of copper to promote plating. The conductive traces (including a second layer of conducive traces on top of the first layer of conductive traces (namely studs) are plated on the copper and then a molding material is deposited over the conductive traces and the carrier. The molding material is then ground away to expose the studs for connection of the premolded substrate to another assembly, e.g., a printed circuit board (PCB). In contrast with conventional subtractive techniques for lead frame formation, the additive process with which these conductive traces are formed allows flexibility in where the pads may be placed. The carrier is then etched away from the other side of the assembly to expose the conductive traces embedded in the molding material. An insulating layer is optionally deposited over the conductive traces in which pads may then be formed where the bumped device to be mounted on the premolded substrate will make contact with the premolded substrate conductive traces. For more information regarding premolded substrate techniques that may be employed with various embodiments of the invention, please refer to U.S. Patent Publication No. 2008/0145967 for Semiconductor Package and Manufacturing Method Thereof published on Jun. 19, 2008, the entire disclosure of which is incorporated herein by reference for all purposes.

Various embodiments of the inventions described herein relate to the use of interconnect substrates, e.g., premolded substrates, for interfacing with bumped semiconductor packages, e.g., flip chips, and, more specifically, bumped semiconductor packages used in power management applications. As used herein, "bumped device" refers to any semiconductor device having an array of conductive elements (e.g., balls, bumps, pillars, etc.) arranged across a surface of the device for making electrical connections to other devices, boards, assemblies, or substrates.

FIG. 1 shows conductive traces in a premolded substrate configured for connecting with an overlying bumped device and also with the control pads and conductive planes on an underlying PCB. According to a particular class of embodiments, the conductive planes represent, for example, the three terminals of a switching voltage regulator, two of which are shown in FIG. 1, i.e., the VX plane and the Ground/VSS plane. As shown, the conductive traces that connect to the underlying conductive planes resemble fingers that alternate or are "interdigitated." The circular studs exposing the conductive traces are aligned with the corresponding conductive plane on the underlying PCB. Connection between the studs and the conductive planes may be made using any suitable technology, e.g., balls, bumps, pillars, paste, etc.

Figure 2:
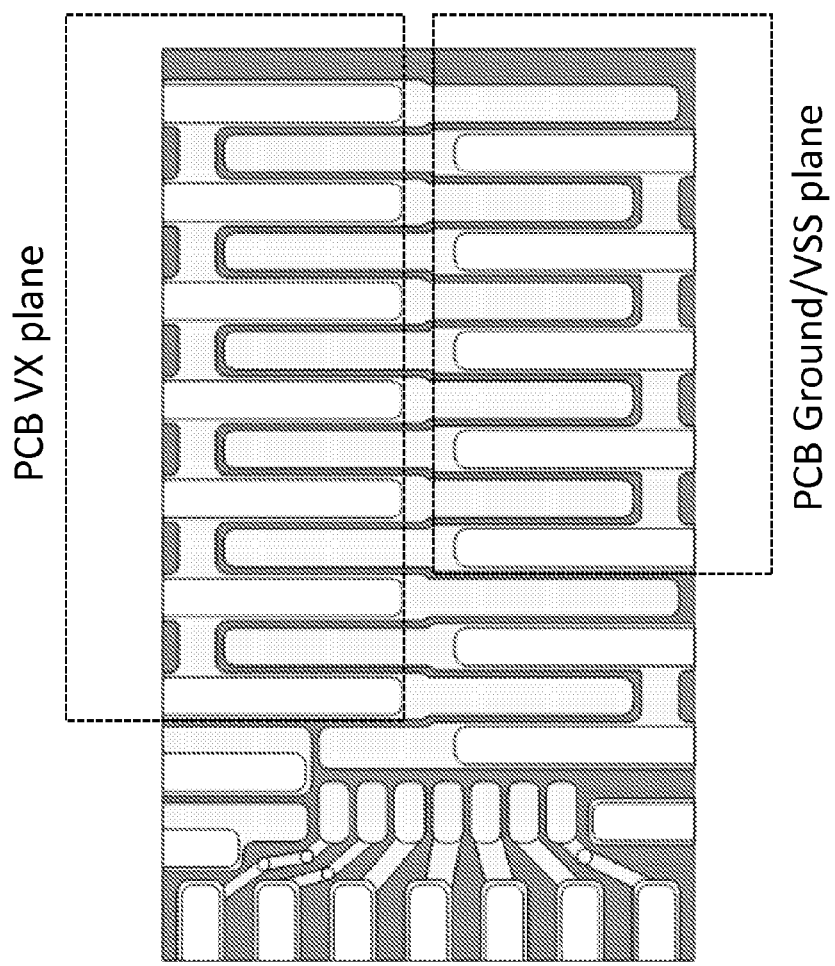
FIG. 2 illustrates another implementation of an interconnect substrate.

FIG. 2 shows conductive traces in another premolded substrate also configured for connecting with an overlying bumped device and also with the control pads and conductive planes on an underlying PCB. Again, in this example, the conductive planes represent the three terminals of a switching voltage regulator. However, in contrast with FIG. 1, the studs are formed along the length of the conductive traces and form lead fingers for connecting with the underlying PCB. In addition, the conductive traces of FIG. 2 that correspond to the same conductive plane on the PCB are electrically connected to each other (via a horizontal bus) in contrast with the isolation between adjacent conductive traces shown in FIG. 1. The electrically connected conductive traces with the equivalent exposed stud after back grinding the mold compound are more clearly represented in FIG. 3.

Figure 3:
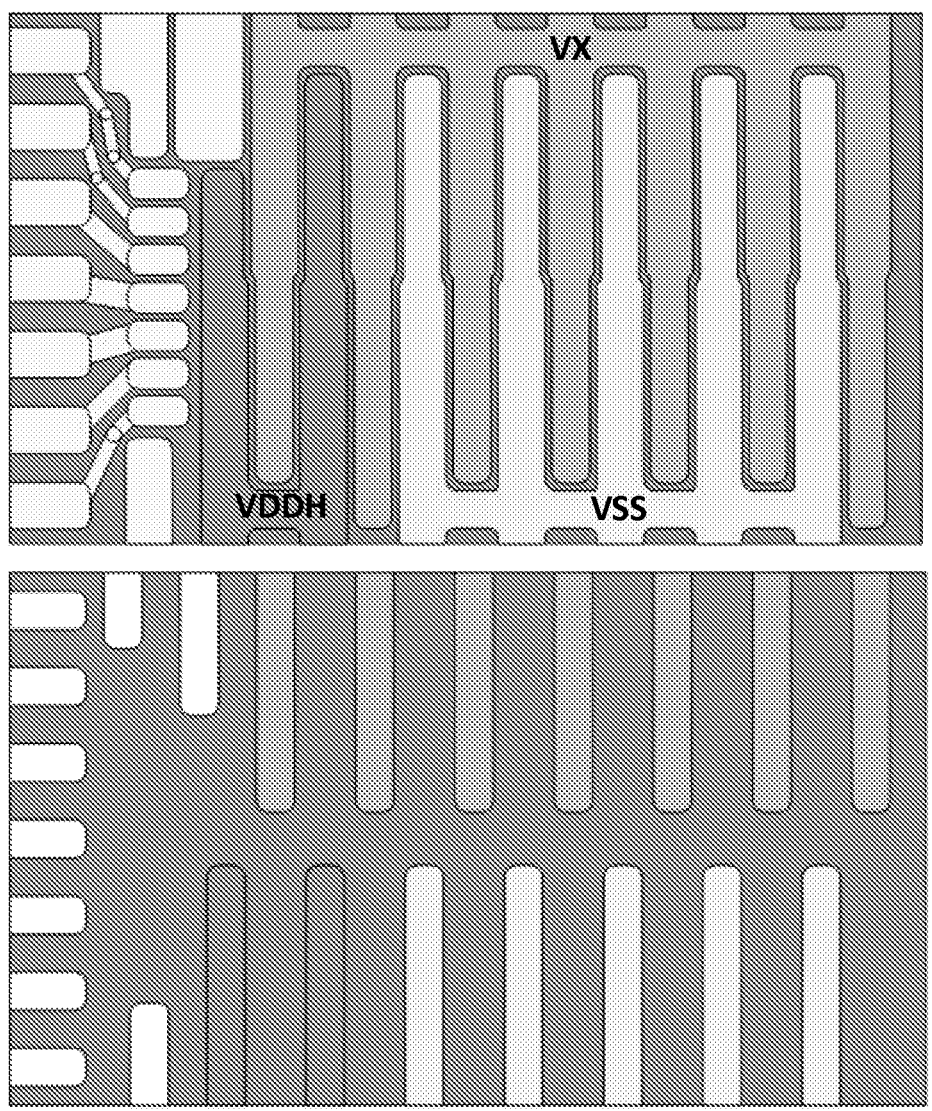
FIG. 3 illustrates another implementation of an interconnect substrate.

The upper portion of FIG. 3 shows the interconnected VX conductive traces, the interconnected VSS conductive traces, and the interconnected VDD conductive traces suspended in the premolded substrate, each set of conductive traces corresponding to a conductive plane on the PCB to which it will be connected. The horizontal bus which interconnects the vertical fingers of each set of conductive traces may be advantageous for some implementations, allowing a single terminal connection to the interconnected conductive traces. Such an approach may also be advantageous in that electrical connectivity may be better ensured in the event of individual lead or connection failure.

Figure 4:
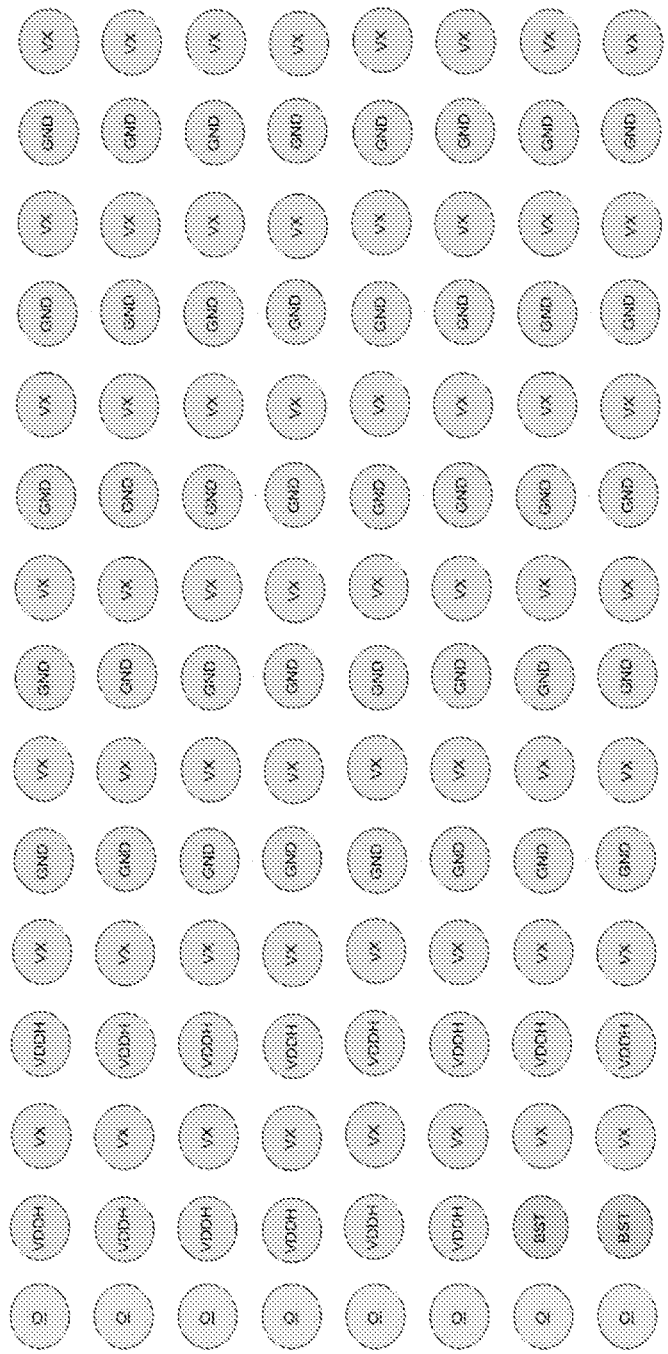
FIG. 4 illustrates a pattern of conductive bumps that may be employed with a particular implementation of an interconnect substrate.

The lower portion of FIG. 3 shows the pattern of studs (in the form of lead fingers) formed on the conductive traces that will make the direct connection to the conductive planes and pads on the underlying PCB. It should be noted that the use of balls, bumps, or pillars instead of leads may result in improvements in board level reliability. Some embodiments are discussed below. It should also be understood that all of these structures (balls, bumps, pillars, studs, etc.) may be formed on isolated conductive traces as well such as those shown, for example, in FIG. 1. FIG. 4 shows an IC pad and pin out layout pattern of balls, bumps, or pillars that may be formed on the conductive traces of the structure shown in the upper portion of FIG. 3 (with VSS being labeled as GND in this example). This pattern of balls, bumps, or pillars may be formed on the premolded substrate conductive traces, IC device or both.

One advantage associated with some of these embodiments is the ability to improve I/O density while maintaining a similar footprint to current designs employing more conventional approaches, e.g., QFN, BGA, TSOP, J-lead, Gull-Wing, etc. Improved I/O density in the context of power management integrated circuits allows designers more flexibility in the control and monitoring of such devices and, in particular, the ability to include I/O to the outside world in the same device as the switching circuitry as opposed to separate control ICs. In addition, the pitch between high current conductive traces (e.g., VX, VSS, and VDD traces) may be reduced with corresponding reductions in resistance and also switching losses). Improvements relating to electromigration may also be realized in that the increased density means that there is more solder per unit area. More uniform distribution of power from increased density may also result in better thermal performance.

Figure 5A:
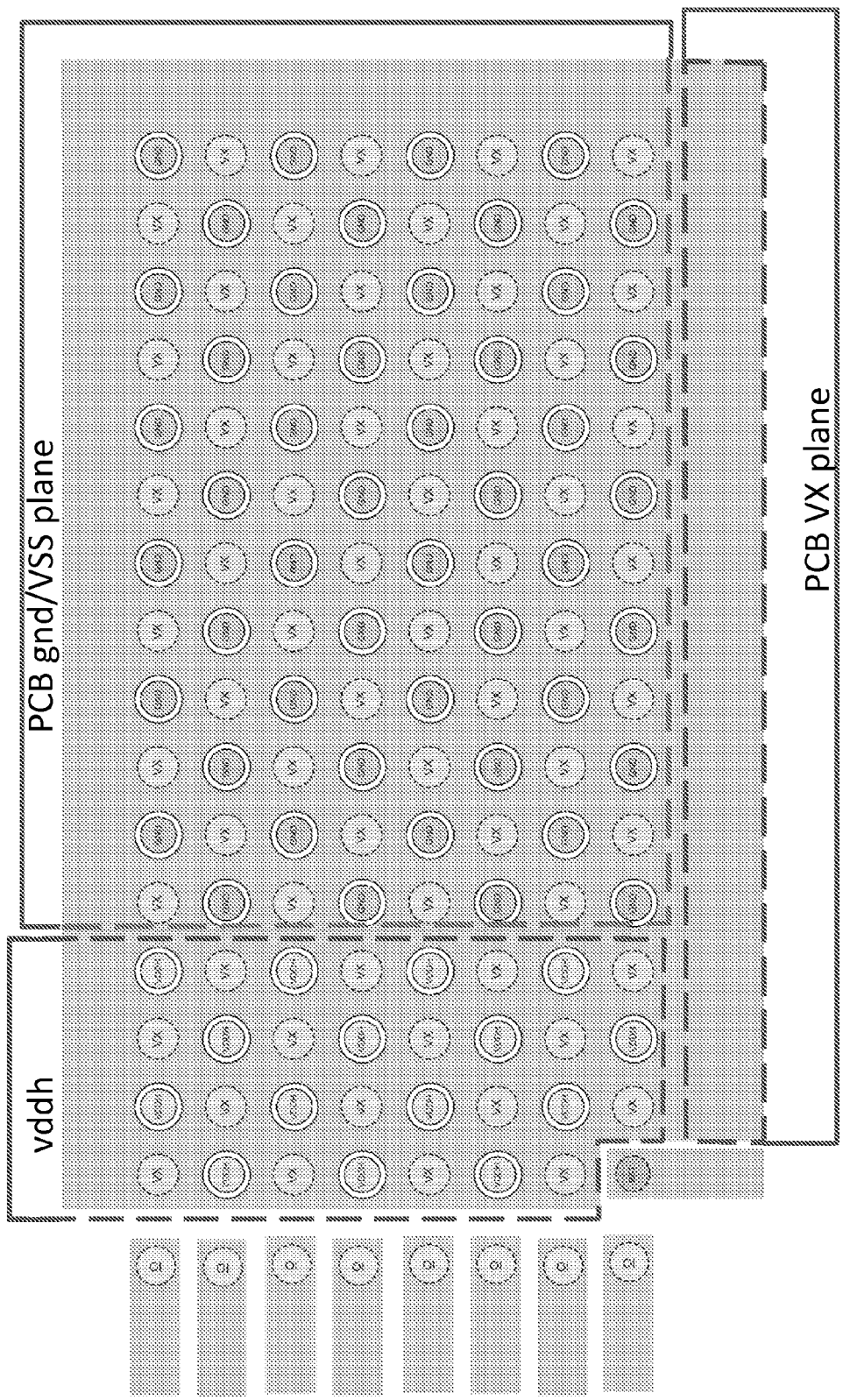
FIGS. 5(a)-5(e) illustrate various components of a particular implementation of an interconnect substrate and a corresponding pattern of conductive bumps.

And it should be appreciated that the conductive trace patterns and connective structures described are merely examples illustrating the many potential configurations and applications of premolded substrates in the context of power management devices and systems. Another example of a configuration in which the balls, bumps, or pillars on the traces are themselves "interdigitated" is shown in FIG. 5(a). As shown, islands are formed in the VX conductive plane for the balls, bumps, or pillars connecting to VDD and VSS/GND. The illustrated pattern is intended to reduce internal metal connection resistance in order to improve total on state resistance (Rdson) of the switching semiconductor element. This approach is also intended to improve PCB connections with the use of solid conduction planes to reduce PCB resistance and improve thermal conductivity. It may also facilitate assembly for PCB mounting due to larger solder pad connections. For more information on techniques for interdigitating conductive traces and/or configurations of balls, bumps, or pillars for use with embodiments of the invention, please refer to U.S. patent application Ser. No. 12/344,134 for Lead Assembly for a Flip-Chip Power Switch filed Dec. 24, 2008, the entire disclosure of which is incorporated herein by reference for all purposes.

Figure 5B:
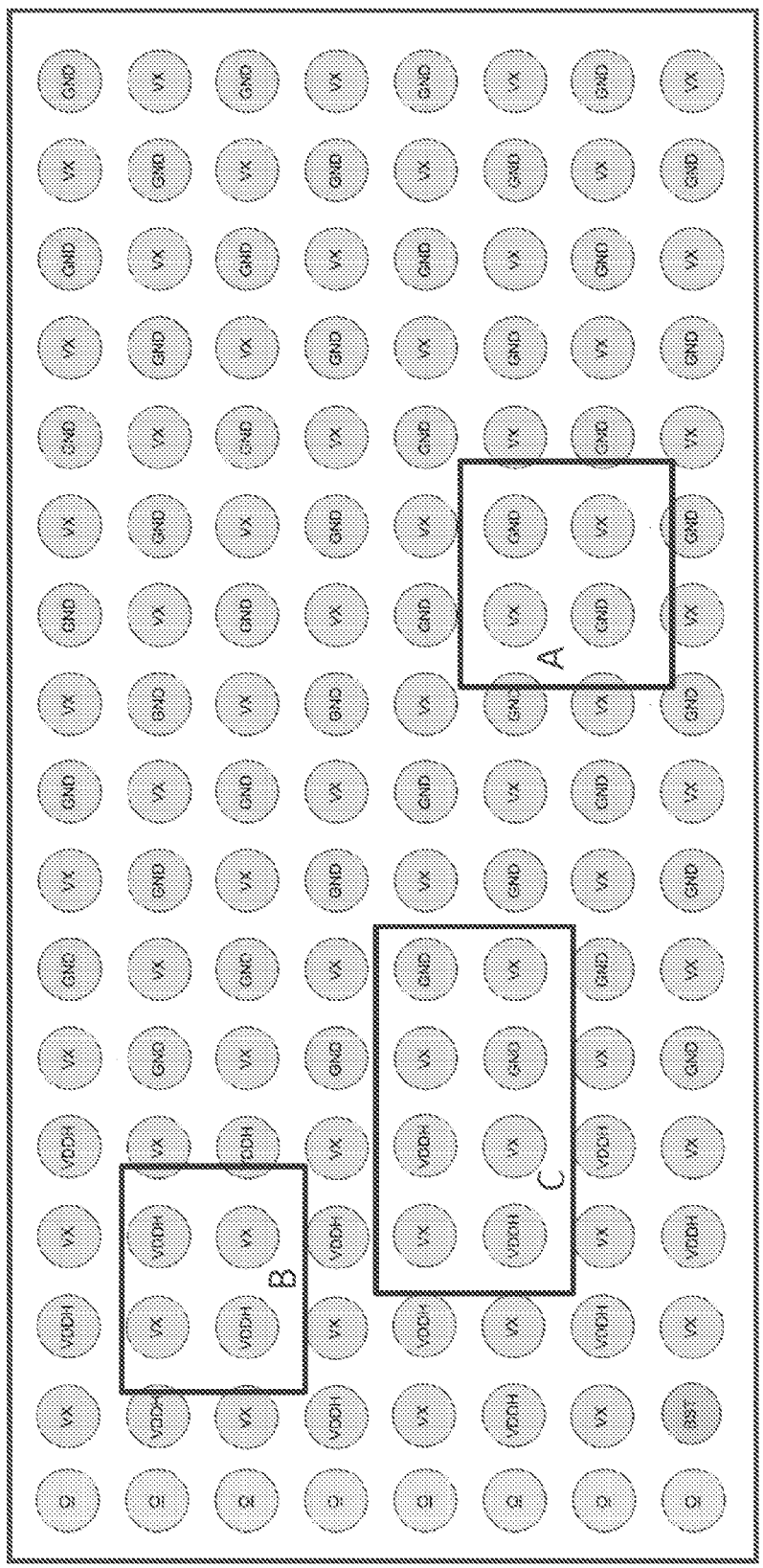
Figure 5C:
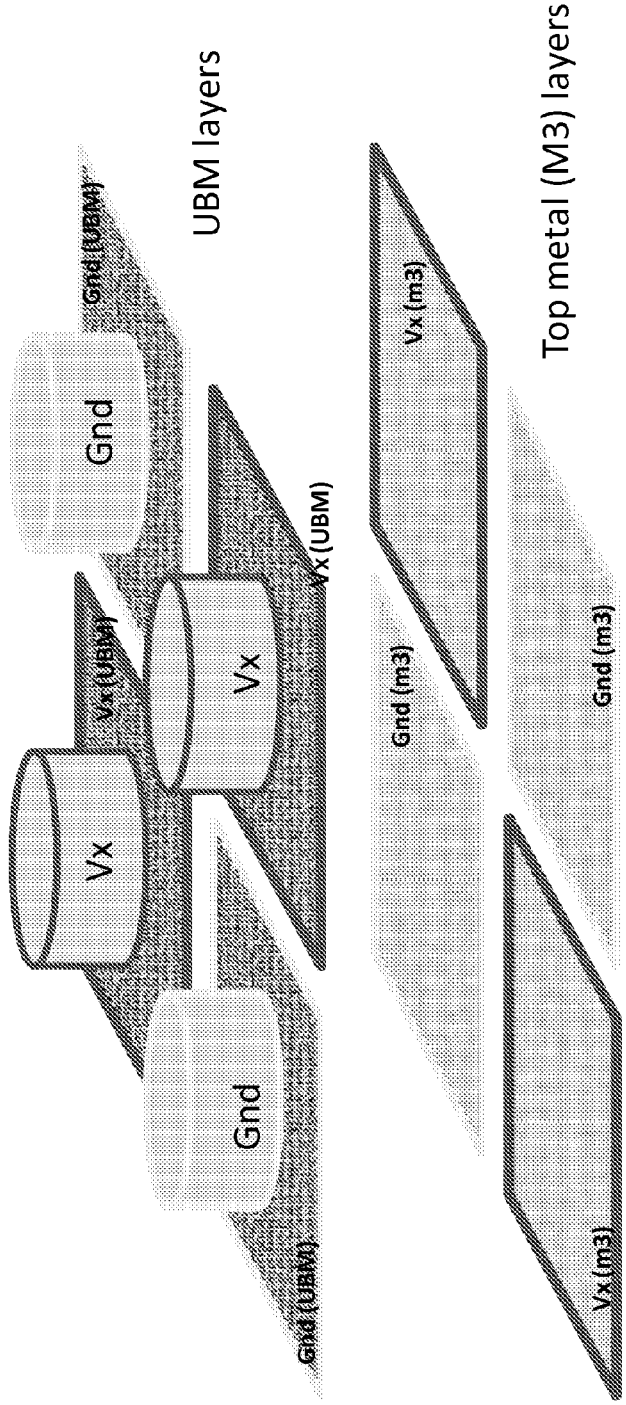
Figure 5D:
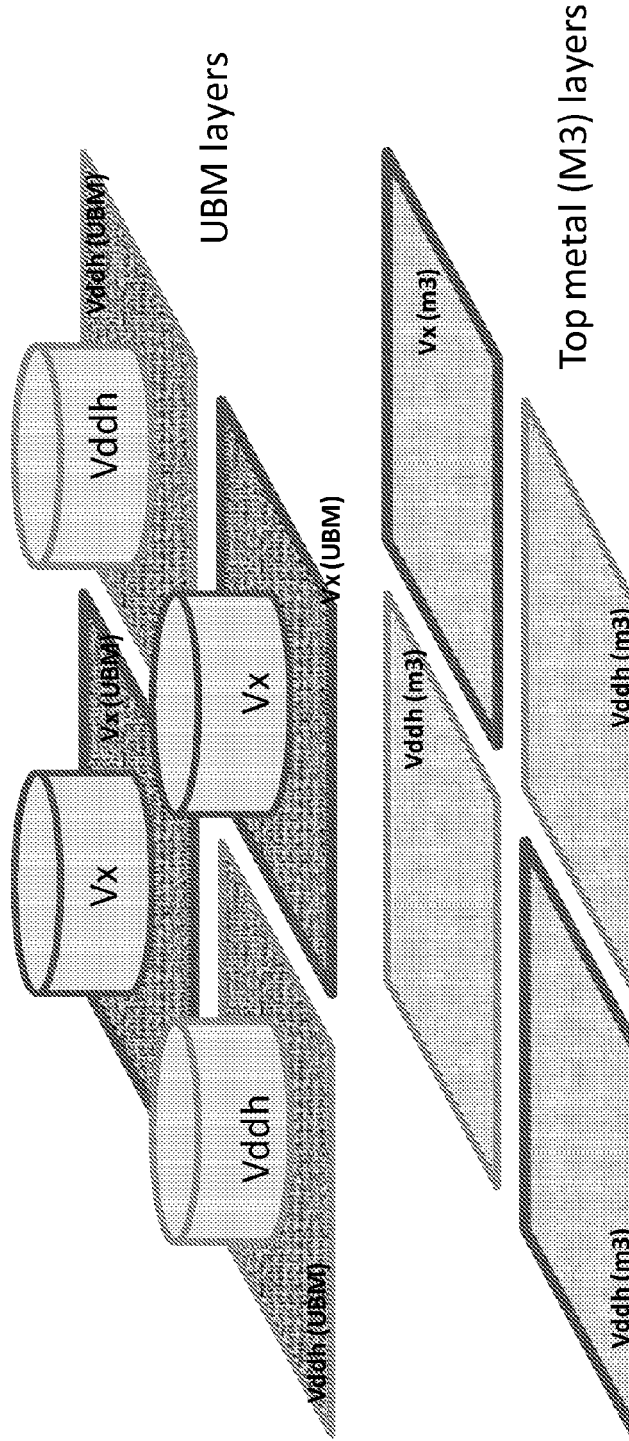
Figure 5E:
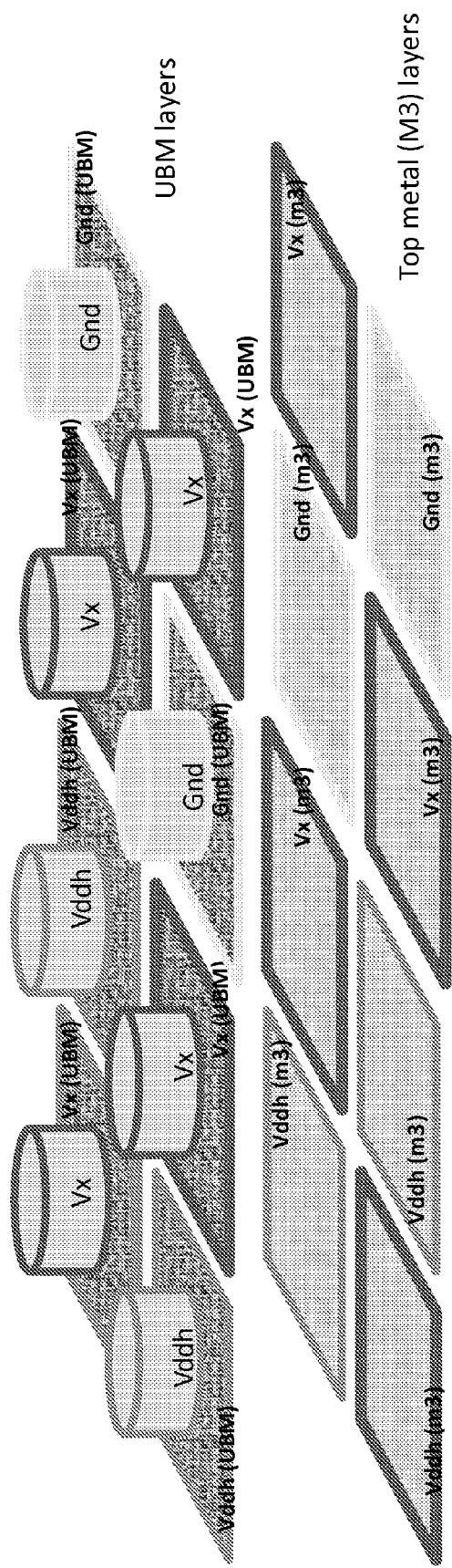

FIGS. 5(b)-5(e) show additional detail of copper pillar bumps and on-chip metal connections for a configuration of interdigitated nodes such as that shown in FIG. 5(a). An exploded perspective view of the detail Area A of FIG. 5(b) is shown in FIG. 5(c) and illustrates the on-chip metal connections for the nodes in Area A. An exploded perspective view of the detail Area B of FIG. 5(b) is shown in FIG. 5(d) and illustrates the on-chip metal connections for the nodes in Area B. An exploded perspective view of the detail Area C of FIG. 5(b) is shown in FIG. 5(e) and illustrates the on-chip metal connections for the nodes in Area C. As shown in each of FIGS. 5(c)-5(e), all of the layers between metal layer 3 (M3) and the under bump metal (UBM) having the same electrical polarity and corresponding to the same regulator terminal are connected through inter-stitches.

The interdigitated configuration of the conductive traces in some of the embodiments discussed herein (e.g., FIGS. 1-3) results in an external device pitch at 2X the pitch of internal traces, i.e., because only every other trace is connected to the same conductive element on the underlying PCB. It follows then that internal device pitch can be reduced to 250 um without pushing the external device pitch of the PCB below its typical limit of 500 um. In a premolded substrate constructed in accordance with embodiments of the invention and having a 40 um spacing between conductive traces, this results in a trace width of 210 um. By contrast, conventional lead frame technology would require a trace width of 100 um; well below the recommended limit for a robust structure. In addition to being fragile, such a trace width would likely be inadequate for current flow, and result in an unacceptably small device pad width (e.g., 100 um); far below the currently acceptable solderable width for conventional lead frame technology.

According to some embodiments, a premolded substrate facilitates not only the fan-in of the I/O sections of the internal device, but also enables the creation of an area array in the I/O section, thus allowing an increase in I/O density compared to peripheral devices such as conventional lead frames. It should be noted that such embodiments can also be realized using LGA or BGA variants of the premolded substrate connectivity to the printed circuit board.

According to some embodiments, the co-location of common traces on one side of the device allows the PCB pitch rules to be relaxed in that all of the traces on the same side (e.g., VX or VSS) can be contacted to a solid conductive plane thus removing the need for fine etching and traces on the PCB for this purpose allowing further reduction of pitch below 500 um in the future. Furthermore, such designs need not place vias in the PCB pads; an approach that causes issues during reflow as such vias trap solder voids and reduce board level reliability. That is, embodiments are contemplated that allow vias in the VX, VSS and VDD planes to be located between solder openings in the solder mask that are configured to connect to the conductive traces, traces of solderable areas of the LGA, and/or solder balls of the BGA variants of the premolded substrates. The vias allow connection of multiple layers in the PCB directly underneath the device. Such an approach can significantly increase via density relative to conventional lead frame designs, thereby enabling lower electrical loss as well as better thermal conductivity from the device package to the board.

Examples of classes of power management devices and systems that may employ suitably configured premolded substrates as described herein include, for example, those described in and covered by the claims of U.S. Pat. No. 6,278,264 for Flip-Chip Switching Regulator issued on Aug. 21, 2001, the entire disclosure of which is incorporated herein by reference for all purposes. A wide variety of other power management devices and systems, and other bumped devices that may benefit from specific embodiments described herein will also be apparent to those of skill in the art.

According to a particular class of embodiments, the backside of the bumped device that is mounted on the conductive traces of the premolded substrate may be exposed. That is, once the bumped device is mounted on the premolded substrate, the combined structure can be molded on all sides except the backside of the bumped device, or it can be overmolded on all sides with a portion of the overmolding being subsequently removed (e.g., by etching or grinding) to expose the backside of the bumped device.

Figure 6A:
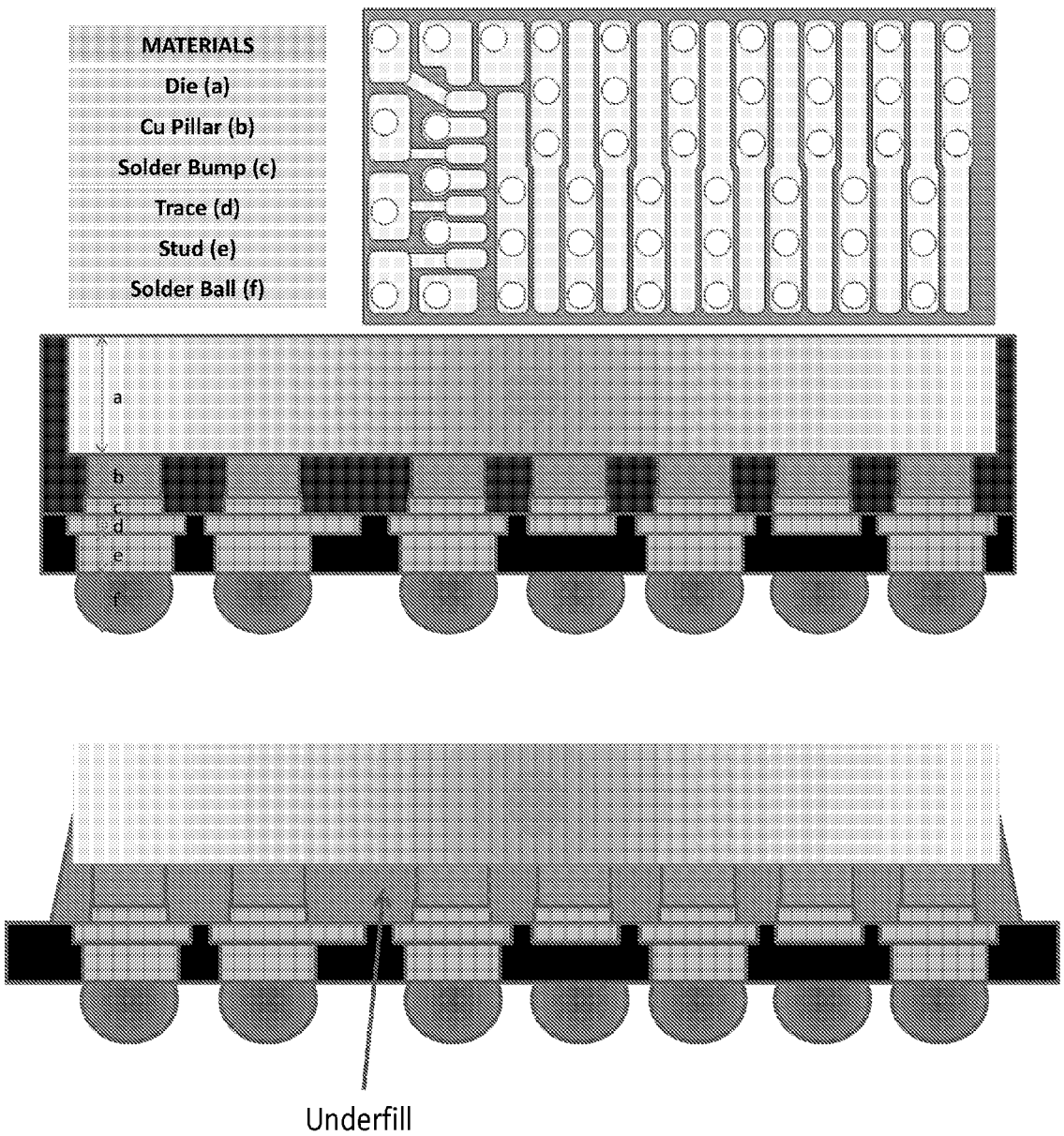
FIGS. 6(a) and 6(b) illustrate further implementations of interconnect substrates and corresponding devices mounted thereon.

FIG. 6(a) shows a premolded substrate similar to the one shown in FIG. 1 as well as two alternative cross-sections of the premolded substrate with a mounted bumped device. In the examples shown, the backside of the bumped device (a) is shown exposed. The bumped device is shown connected to the conductive traces (d) of the premolded substrate via copper pillars (b) and solder bumps (c) although a variety of other types of connections can be employed. The studs (e) along the conductive traces also have solder (in the form of solder balls (f) in this example) for making the connection to the PCB (not shown).

And as shown in FIG. 6(a) (lower device cross-section), embodiments of the invention may employ conventional underfill to fill in the spaces between the connections to the bumped device. That is, once the bumped device is attached and before an overmolding is applied, an underfill material is dispensed which flows underneath the device and fills the interstices under the device by a capillary action. The underfill material may be any suitable conventional underfill material and is well suited for implementations having high I/O density with an extremely fine pitch.

Figure 6B:
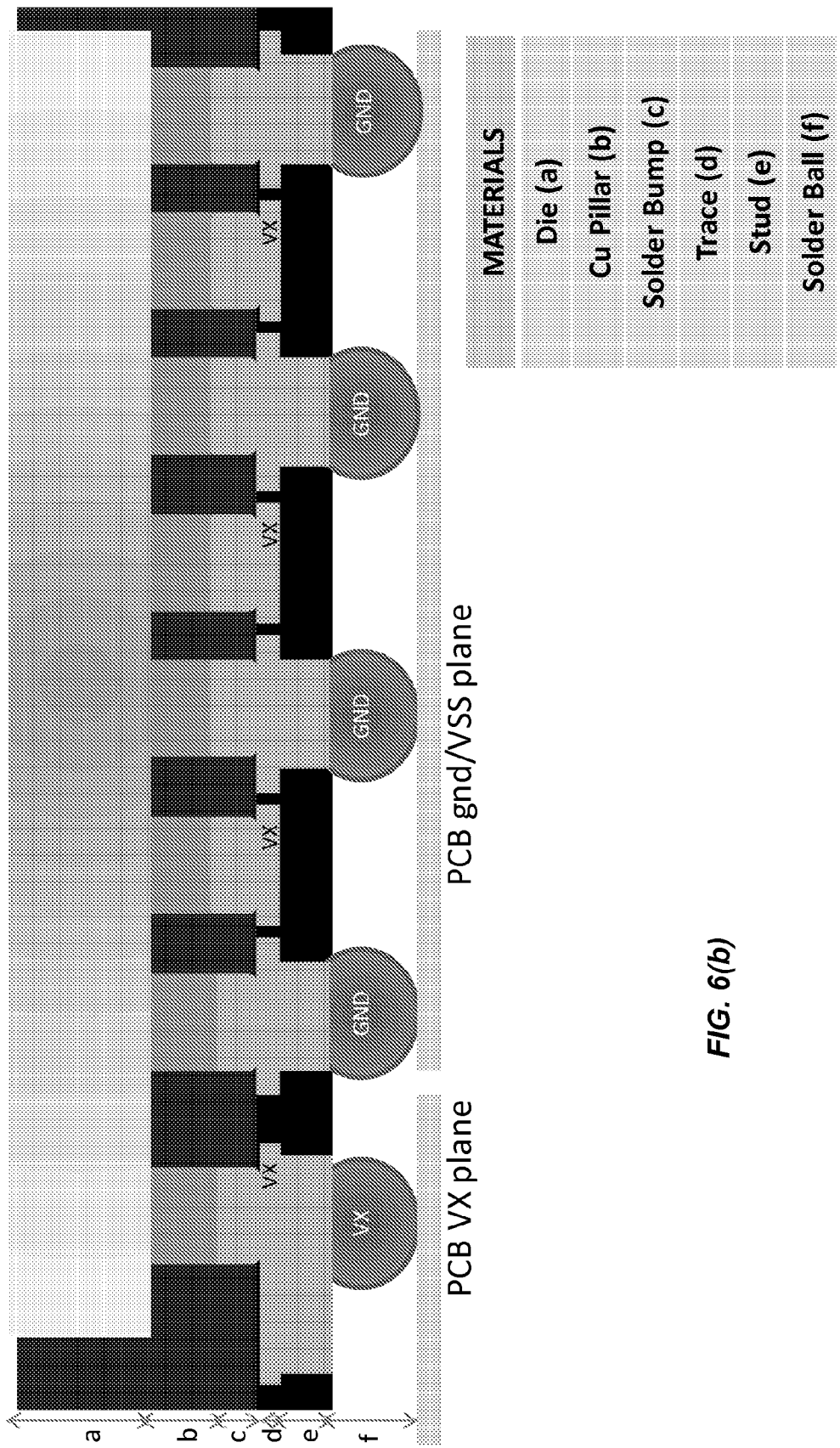

Alternatively, embodiments are contemplated in which a molded underfill may be employed (upper device cross-section in FIG. 6(a)). Molded underfill replaces the dispensed underfill with a molding material which is introduced using a molding-type process. The coarser materials included in the molding compound make the process more challenging than dispensing conventional underfill (particularly for extremely fine pitch applications), but the materials are considerably less expensive. Molded underfill may also contribute to improved reliability in that it may provide more robust mechanical and/or environmental protection than conventional underfill materials. FIG. 6(b) shows another premolded substrate similar to the upper device cross-section of FIG. 6(a), but in which the balls, bumps, or pillars on the traces are interdigitated in a manner similar to that shown in FIG. 5(a).

Figure 7:
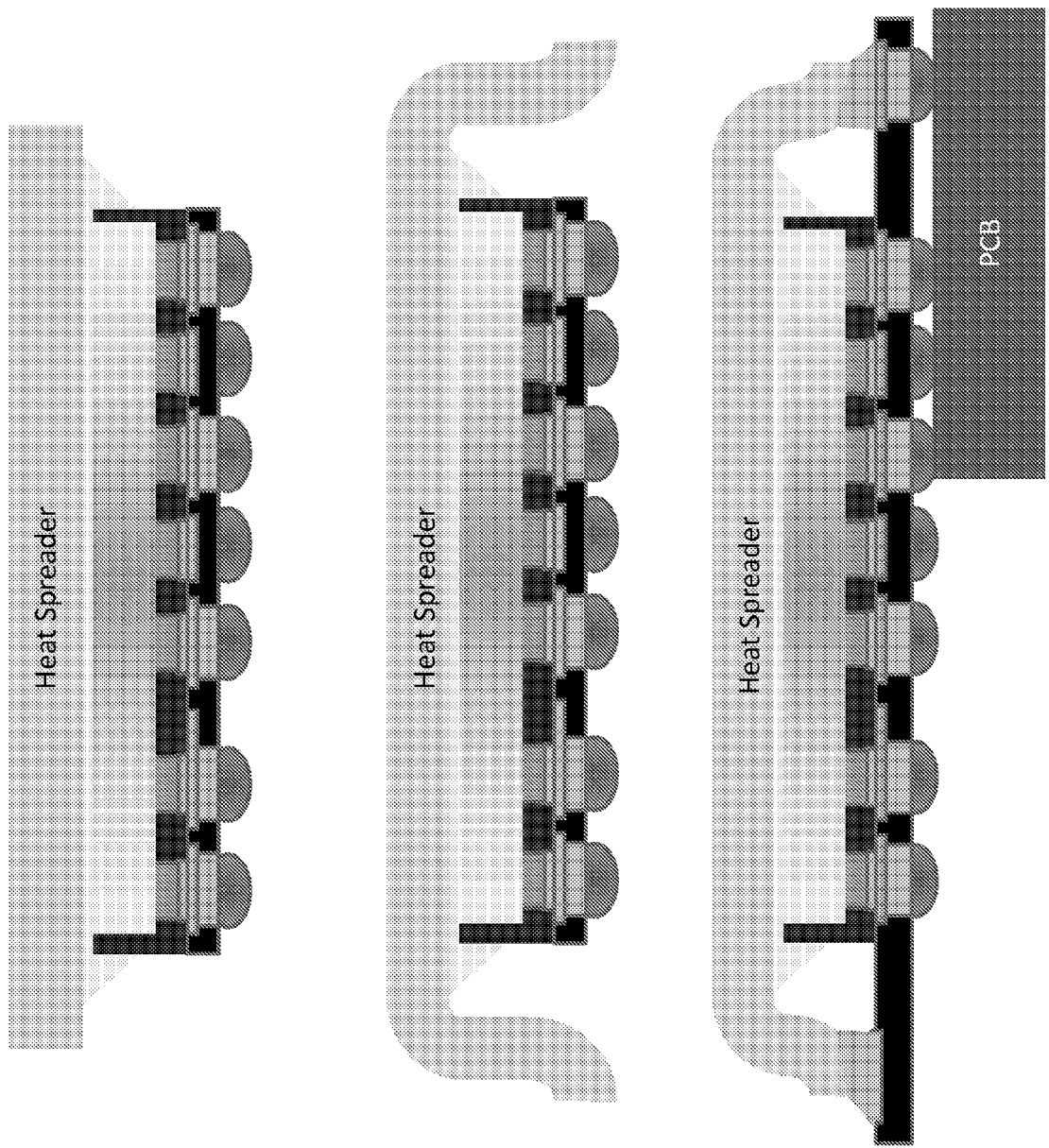
FIGS. 7 and 8 illustrate implementations of interconnect substrates with devices and heat spreaders mounted thereon.
Figure 8:
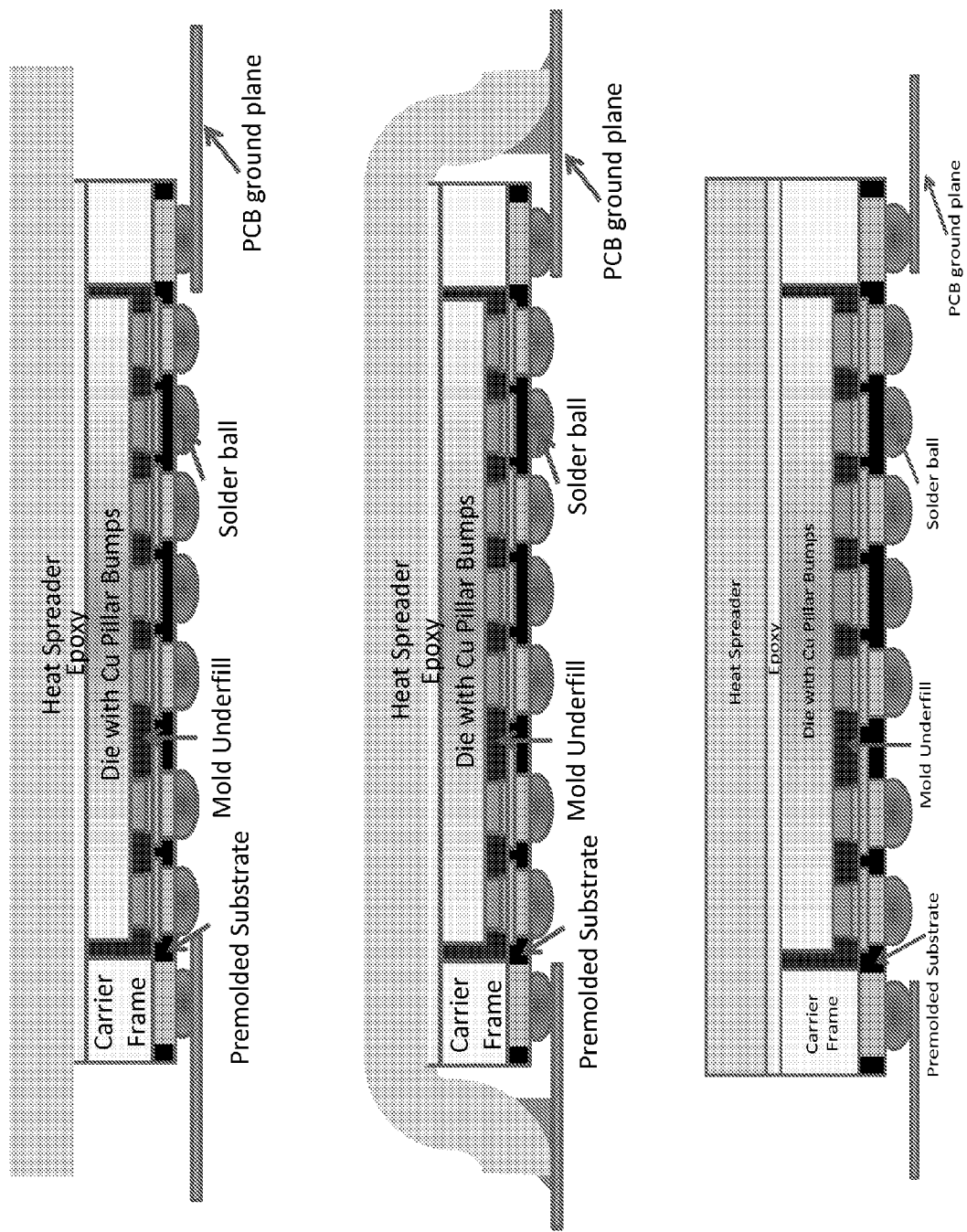

According to a class of embodiments illustrated in FIGS. 7 and 8, heat spreader structures are connected to the exposed backside of the mounted bumped device to provide thermally conductive pathways for removal of heat from the bumped device. FIG. 7 illustrates three heat spreader configurations that provide thermal conduction in two dimensions, i.e., up through the heat spreader, and laterally to the portions of the heat spreader that extend beyond underlying semiconductor device. Integrated heat spreader extensions can be used as thermal and/or electrical connections. As shown in the middle illustration of FIG. 7, the heat spreader can be brought down into contact with the PCB to promote additional heat transfer via the PCB through convection. As shown in the bottom illustration of FIG. 7, integrated heat spreader extensions can also be attached to the premolded substrate conductive traces and/or to the PCB via studs and solder joints. Such embodiments may be particularly important as the power per unit die area and I/O density continue to increase.

According to a particular class of embodiments illustrated in FIG. 8, at least a portion of the carrier substrate (i.e., the carrier frame) is maintained around the edges of the window etched away to expose the conductive traces suspended in the premolded substrate. The frame may be rectangular and continuous around the device, or in one or more discontinuous segments around the edge, e.g., at the four corners of the assembly, along one or more edges, etc. This carrier frame provides additional thermal path(s) to the PCB for improved thermal performance. The upper two diagrams show embodiments in which the heat spreader extends beyond the carrier frame in a manner similar to the embodiments shown in FIG. 7. It should be noted that these heat spreader extensions may also be connected to the premolded substrate conductive traces and/or to the PCB as shown in the bottom diagram of FIG. 7. The bottom diagram shows an embodiment in which the heat spreader does not extend beyond the carrier frame, and the primary thermal path to the PCB is therefore via the carrier frame. In the depicted example, the carrier frame is shown connected to the PCB ground plane. Also contemplated are heat spreader structures having multiple disconnected or partially connected portions, and/or one or more apertures. Such structures may reduce stresses that might otherwise result from thermal expansion or mechanical strain acting on a device having a continuous heat spreader.

Heat spreader structures which may be used with various embodiments of the invention are described in U.S. patent application Ser. No. 12/716,197 for Chip-Scale Packaging with Protective Heat Spreader filed Mar. 2, 2010, the entire disclosure of which is incorporated herein by reference for all purposes.

Figure 9:
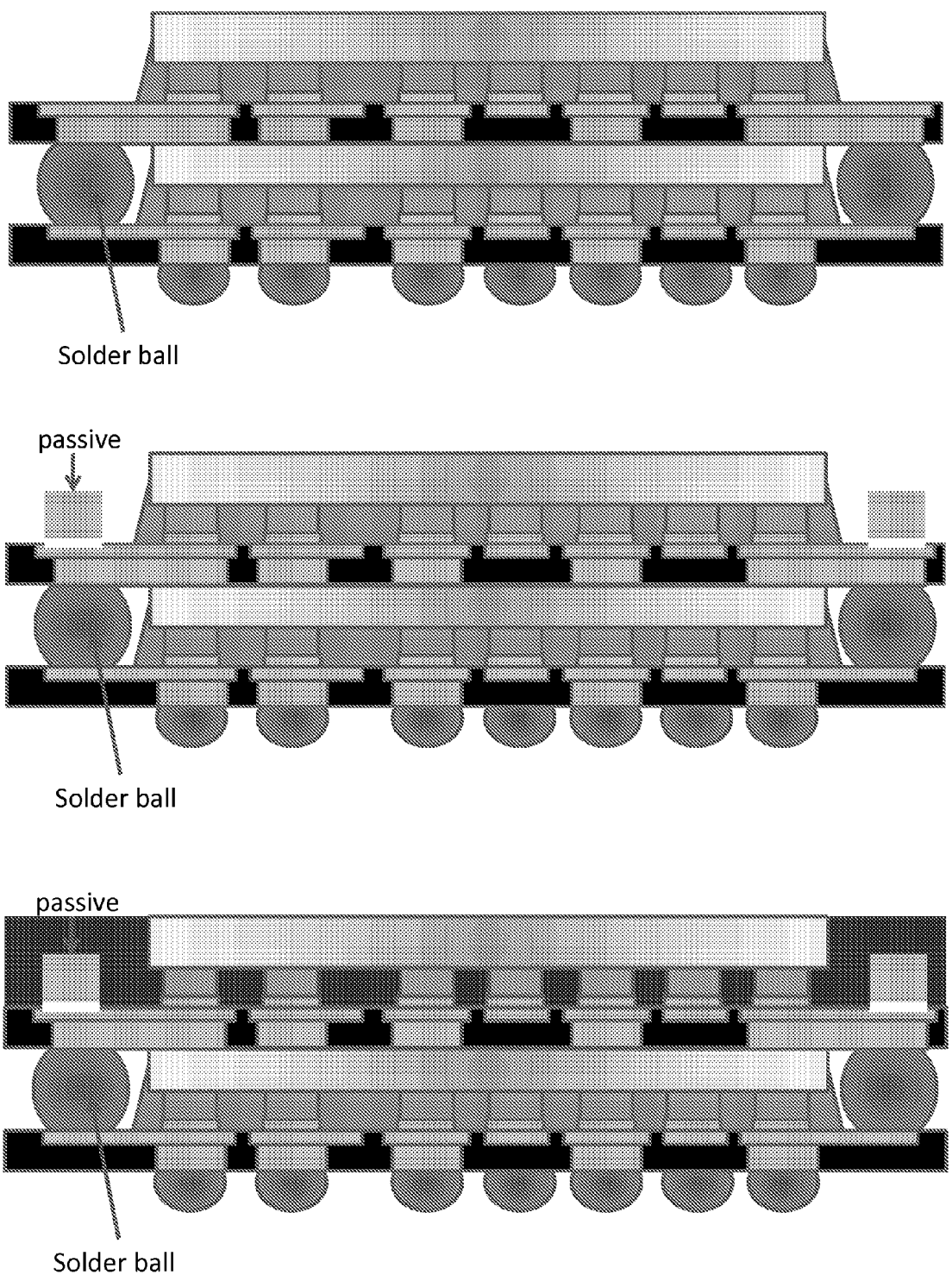
FIG. 9 illustrates stacked interconnect substrates and devices.

Embodiments are contemplated in which multiple premolded substrates enable the stacking of bumped devices and/or other active or passive components as shown in FIG. 9. The top diagram shows two premolded substrates stacked with two bumped devices (with underfill), in which electrical connections between the two devices are made around the edge of the lower device in the stack (solder balls are shown, but any suitable structure can be used). The middle diagram shows the addition of a passive component (e.g., capacitor, resistor, inductor, etc.). The bottom diagram shows the use of molded underfill as discussed above. The depicted uses of conventional or molded underfill are merely examples. Embodiments are also contemplated in which one premolded substrate/bumped device assembly could use conventional underfill while another uses molded underfill. It should also be understood that stacking is not limited to two assemblies, i.e., that an arbitrary number of devices and premolded substrates may be stacked as described herein as appropriate for particular applications.

Figure 10A:
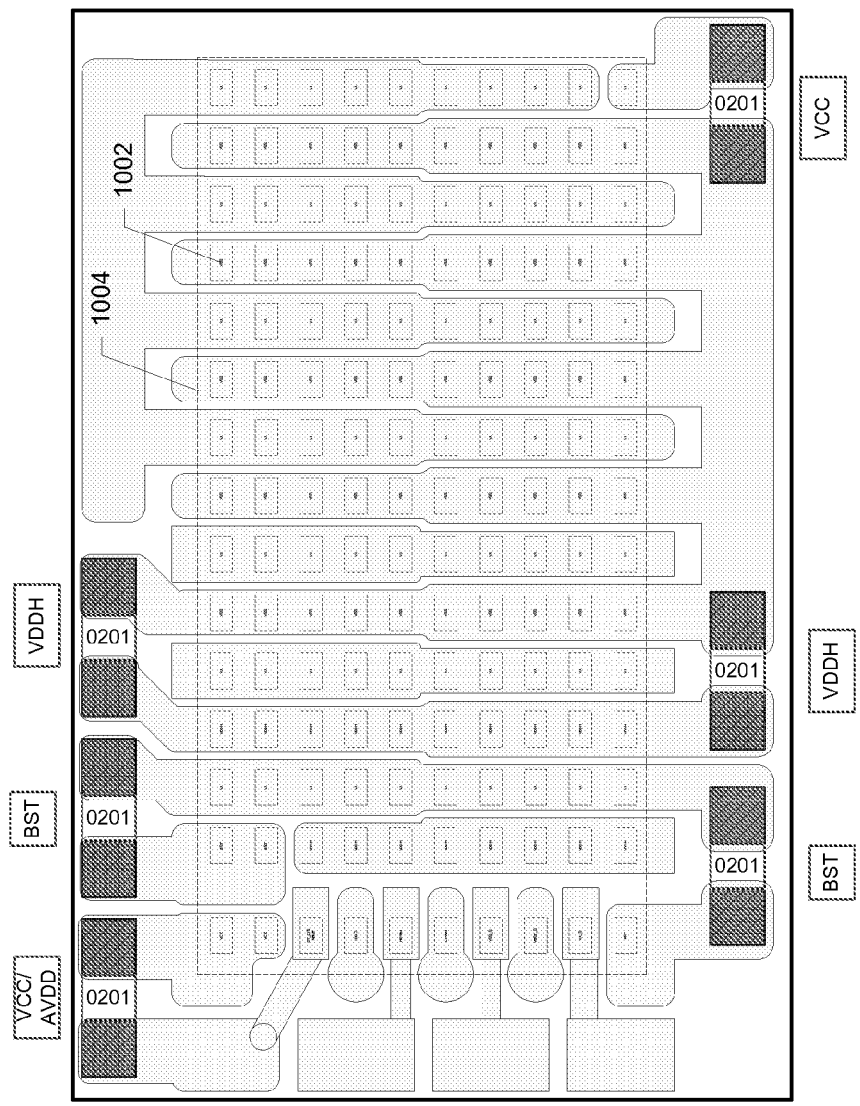
FIGS. 10(a)-10(c) illustrate various aspects of a particular implementation of an interconnect substrate with passive components mounted thereon.
Figure 10B:
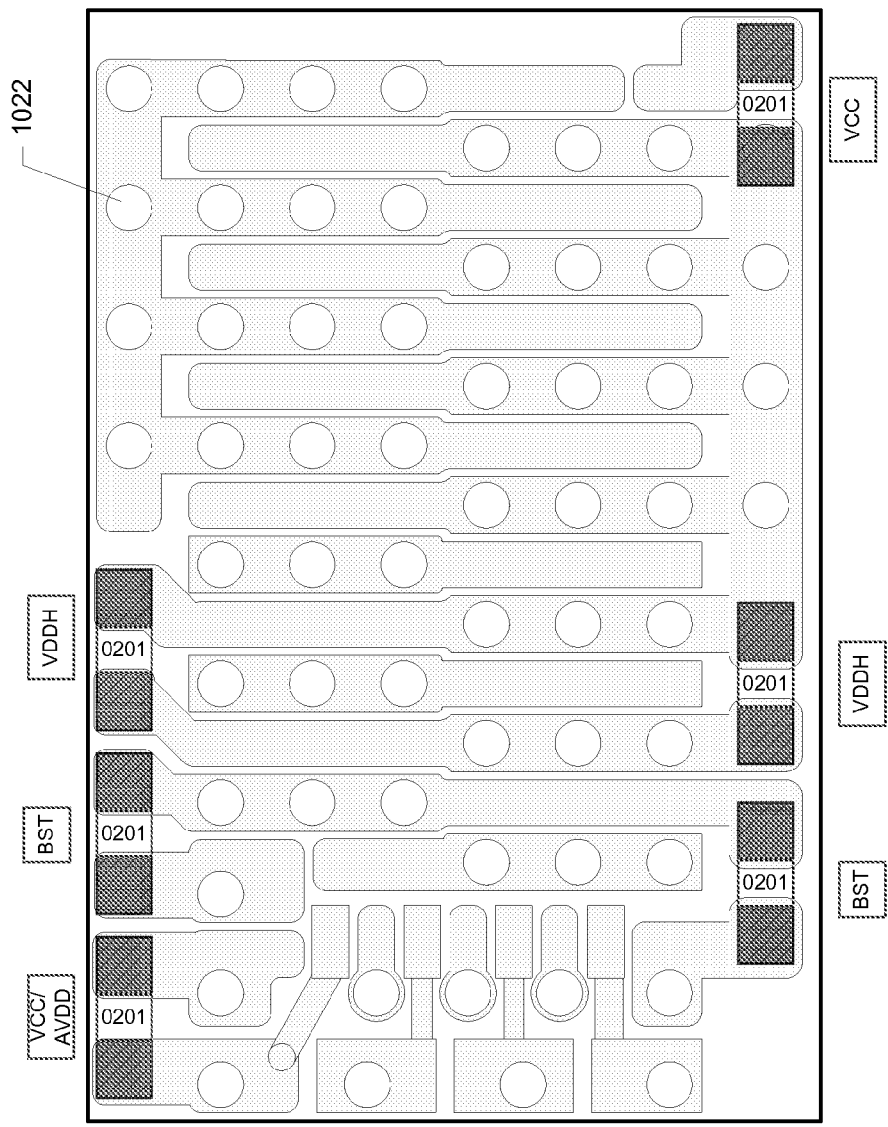
Figure 10C:
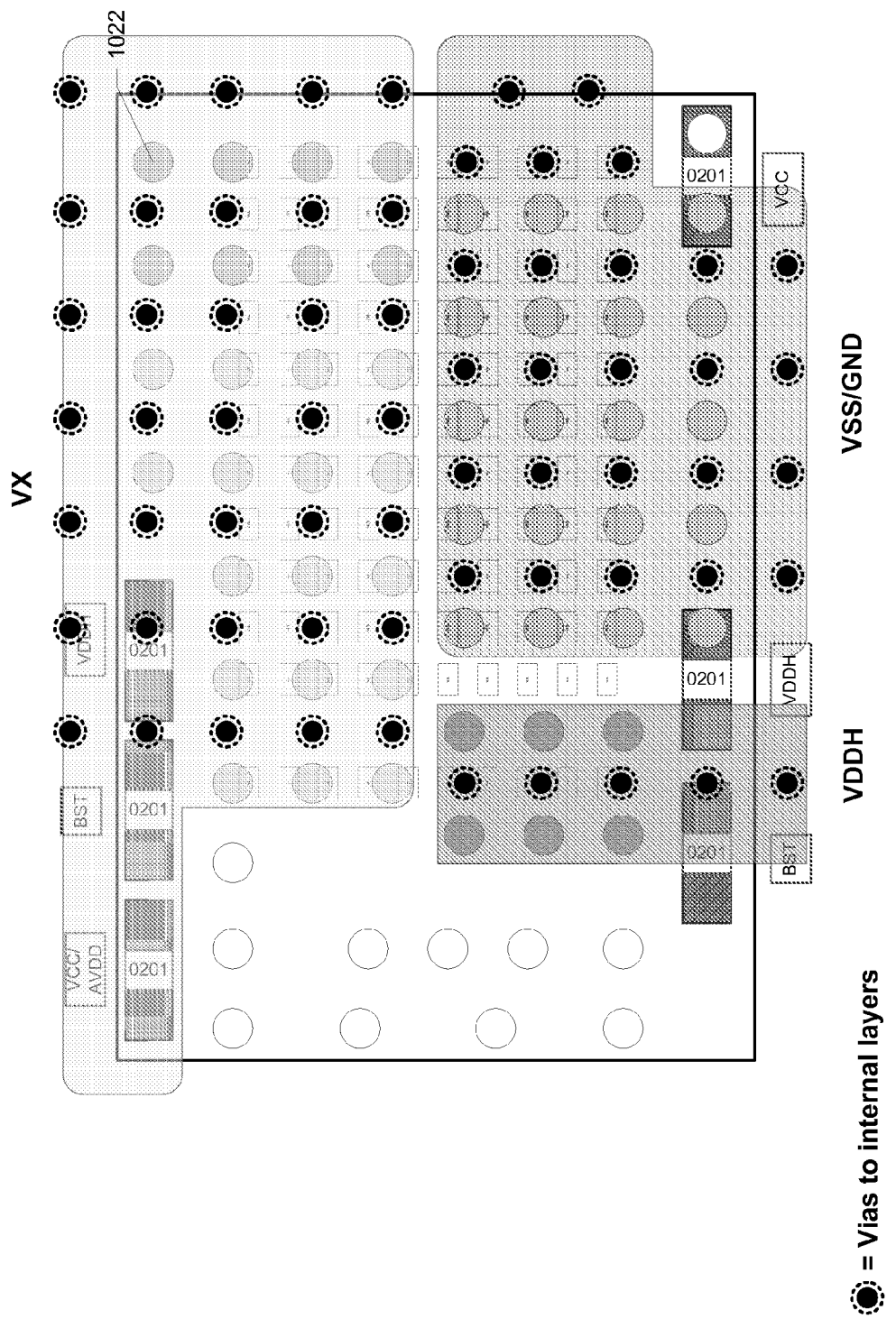

FIGS. 10(a)-10(c) show different views of an embodiment in which passive components, in this case decoupling capacitors (components 0201), are provided on both edges of the die (connected between the hatched rectangular pads) even though external pads for VDDH and VCC are only provided along one edge of the die. FIG. 10(a) shows the orientation of the bumps (e.g., 1002) on the overlying die 1004 to the conductive traces of the premolded substrate. FIG. 10(b) shows the pattern of balls, bumps or pillars (e.g., 1022) on the conductive traces of the premolded substrate for connecting to the underlying PCB. FIG. 10(c) shows the orientation of the VX, VDDH, and VSS/GND conductive regions of the underlying PCB to the balls, bumps or pillars (e.g., 1022) on the conductive traces of the premolded substrate to which the conductive planes connect, as well as the vias to internal layers of the PCB.

The advantage of having the VDDH to VCC (or Analog VDD) capacitors on both edges of the die is that effective high frequency decoupling is limited by the stray inductance in connecting the capacitor to the die in question. Stray inductance switching loss is important in lieu of the high current requirement chips as it contributes $LI^2f$ switching loss which at 1 Mhz switching frequency makes 1 nH equivalent to 1 mOhm loss. Having two capacitors on two edges of the die cuts the stray inductance in half compared to a capacitor on one edge of the die. One could achieve the same by placing external pads for VDDH and VCC on both edges of the package but that would restrict the location for routing the switching node of the regulator out of the die. In this way, while the decoupling is provided on both edges of the die using internal routing, the external routing is limited to having VDDH and VCC on one edge of the package and having switching node VX on the other edge of the package. Furthermore, one can also co-locate the boot strap (BST) and driver decoupling capacitors on the same edges as the high frequency decoupling capacitors. Integrating these capacitors inside the package can potentially remove the need for having the I/O for these connections outside of the package (apart from the need to have them accessible for automated test). As such, the routing of VCC-driver supply and VBST-boost supply can be provided on internal I/O that do not have the requirement to be routable on the PCB but only accessible during automated test. Integrating any kind of capacitor is advantageous even if they are only on one side of the die as the stray inductance to that capacitor is reduced relative to a PCB mounted capacitor that would be physically further away (by the thickness of a conventional lead frame) than with the shown structure. Embodiments of the premolded substrates described herein allow the integration of capacitors on both sides of the die due to flexibility in their internal routing. These premolded substrates offer benefits relative to conventional lead frames as the standoff of the finer pitch die from the conductive traces/leads can be lower and the capacitors can be smaller thus allowing lower inductance connections for capacitors bypassing the devices. Finally, inductance is somewhat defined by the distance that current travels in closing the loop and the distance between the return paths in that loop. Pre-plated traces with 30-40 um pitch additionally add to the reduction of stray inductance between the die and the capacitors as the high frequency currents will travel the closest possible path (i.e., the surface of the conductors) and thus the spacing of the conductors will inevitably define the stray inductance of the connections. And while the integrated passive components are shown at the edge of the devices, it should be understood that embodiments are contemplated in which passive components may be integrated in such structures between pillars (e.g., between the pillars shown in any of the structures depicted in FIGS. 6(a)-9) to further reduce inductance.

While only the capacitors are shown as integrated one could integrate passive components such as resistors into the same package and thus create accurate references for the chip more easily than using on-die resistors. Such off-die resistors can have controlled temperature coefficients, yet their temperature can be closely related to the die temperature as they are co-packaged close to the die. Again these internal resistors could be only accessible during ATE test or not accessible whatsoever from ATE but only through the die-ATE test interface.

Figure 11:
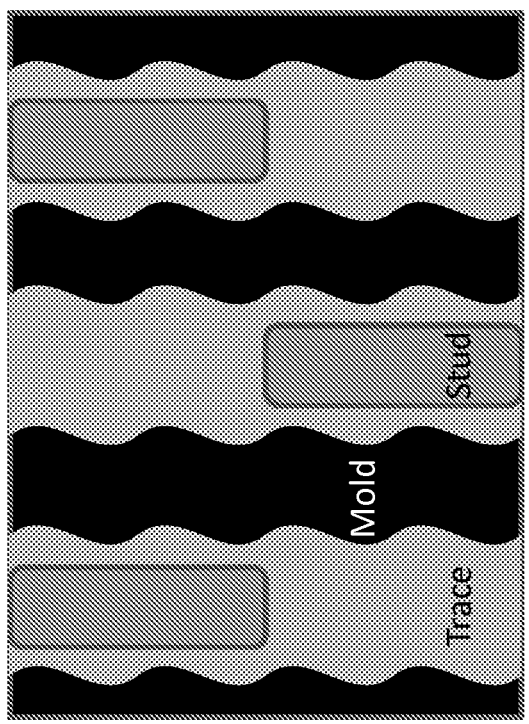
FIG. 11 illustrates various implementations of conductive elements in particular implementations of interconnect substrates.
Figure 11:
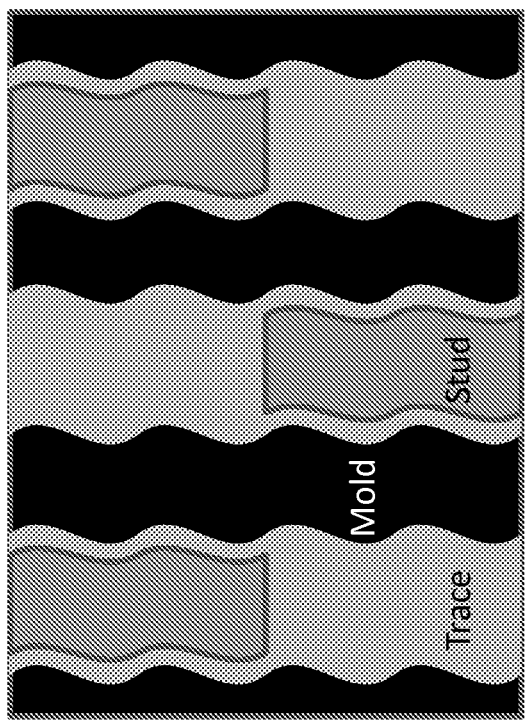

As the distance between conductive traces in the premolded substrate becomes smaller, adhesion between the metal (e.g., copper) of the traces and the molding compound in which the traces are suspended may become a reliability issue. Therefore, embodiments are contemplated in which this adhesion is improved or optimized by controlling the thicknesses of the traces, the widths of the traces, and/or the distance between traces in relation to one another. In addition, and according to some embodiments, a variety of structural features may be introduced in the traces and studs to promote adhesion. Examples of such structural features are shown in FIG. 11. In the left-hand diagram both the traces and the studs for connecting the premolded apparatus to the PCB are wavy to increase the amount of surface area at which the different materials interface. In the right-hand diagram wavy traces are combined with straight studs. A wide variety of other traces variations (e.g., jagged, zig-zag, irregular, edge perforations, edge protrusions, etc.) may be suitable for various implementations. Another advantage of some structural features is that they may act to inhibit cracks in the molding material from propagating along the material. That is, the structural features of the conductive traces and studs may provide termination points that act as "crack arrests."

Figure 12:
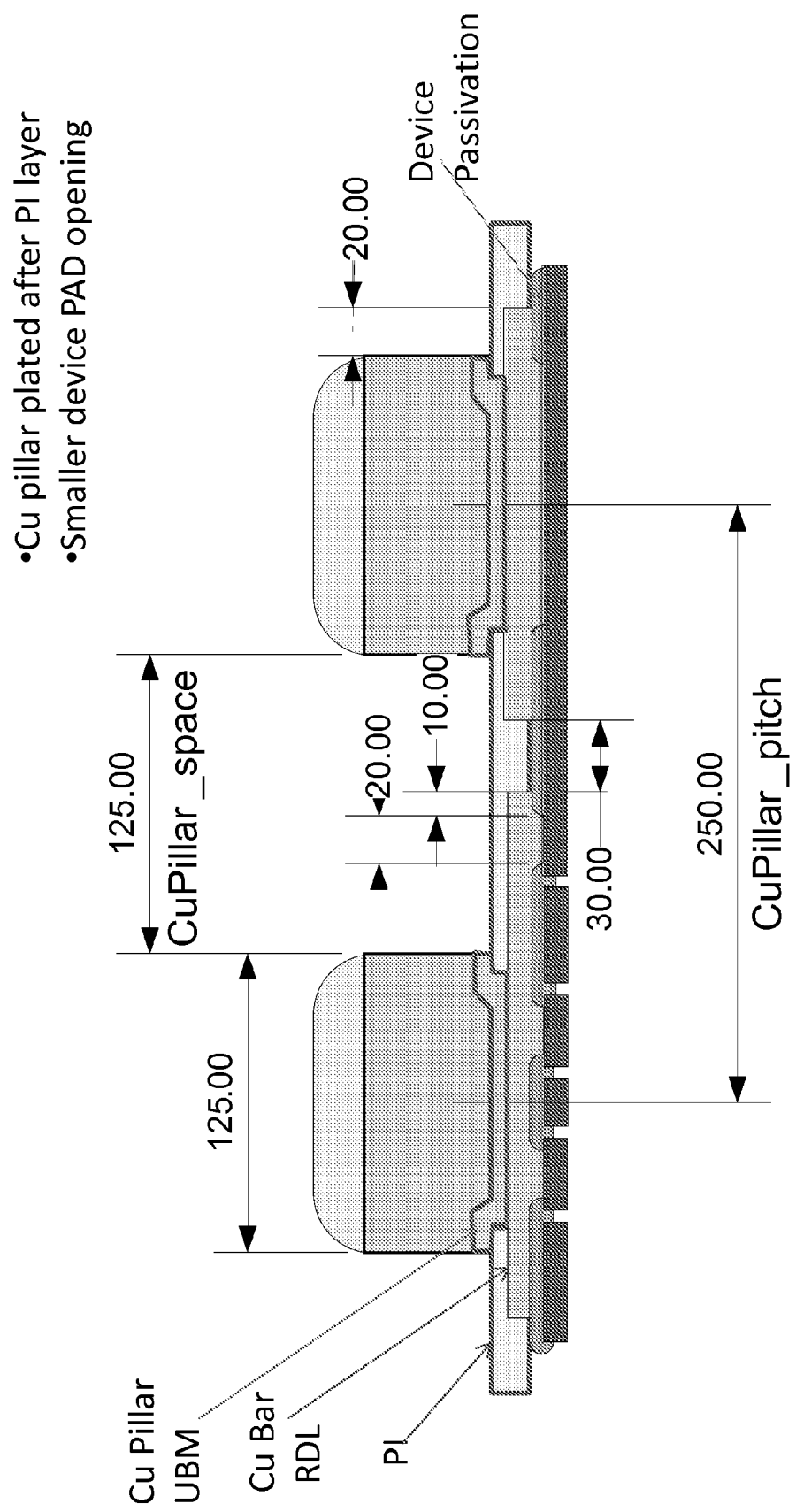
FIGS. 12 and 13(a)-13(c) illustrate conductive structures that may be employed with various implementations.

According to a particular class of embodiments, the external connections on a bumped device (e.g., a flip-chip to be mounted on the conductive traces in a premolded substrate) are copper pillar structures as shown in FIGS. 12 and 13(a)-13(c). It should be noted that such structures may also be formed on the conductive traces of the premolded substrate. Conventionally, fabrication of such a structure involves a series of process steps by which an "under bump metallization" or UBM layer is introduced over a die pad opening or on a copper bar redistribution layer (RDL) previously formed over the die pad openings as shown in FIG. 12. A re-passivation (e.g., polyimide (PI)) is then formed, followed by a sputtering step to form the UBM to promote plating. The pillar structure is then plated on the UBM. In addition to requiring a number of process steps, this approach places a limit on the width of the pillar (e.g., because of registration tolerances, etc.) which may be unsuitable for some applications. Therefore, according to a particular class of embodiments, processes for forming copper pillars directly on the RDL copper without a UBM, or directly on the device pad openings (with or without UBM) are provided.

Figure 13A:
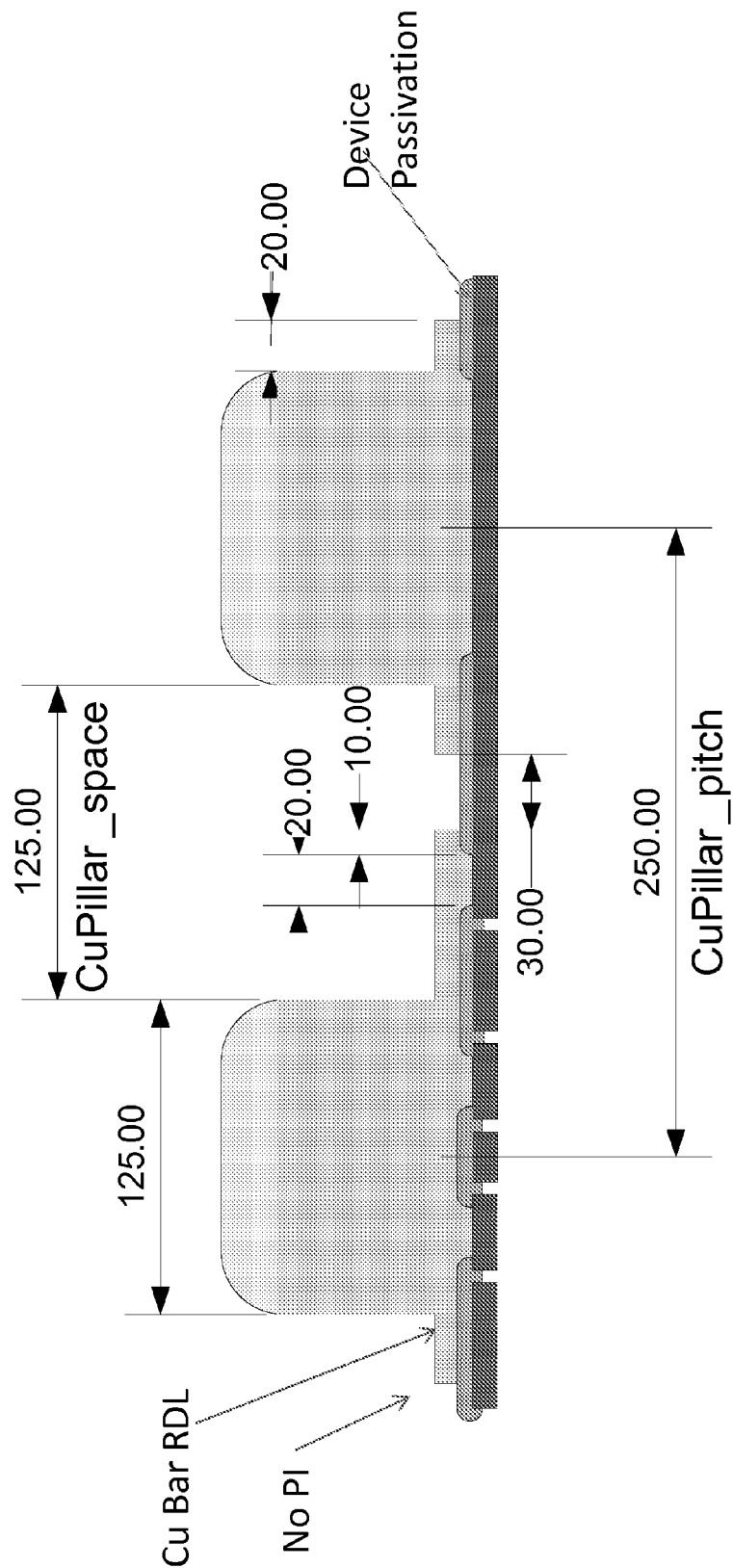
Figure 13B:
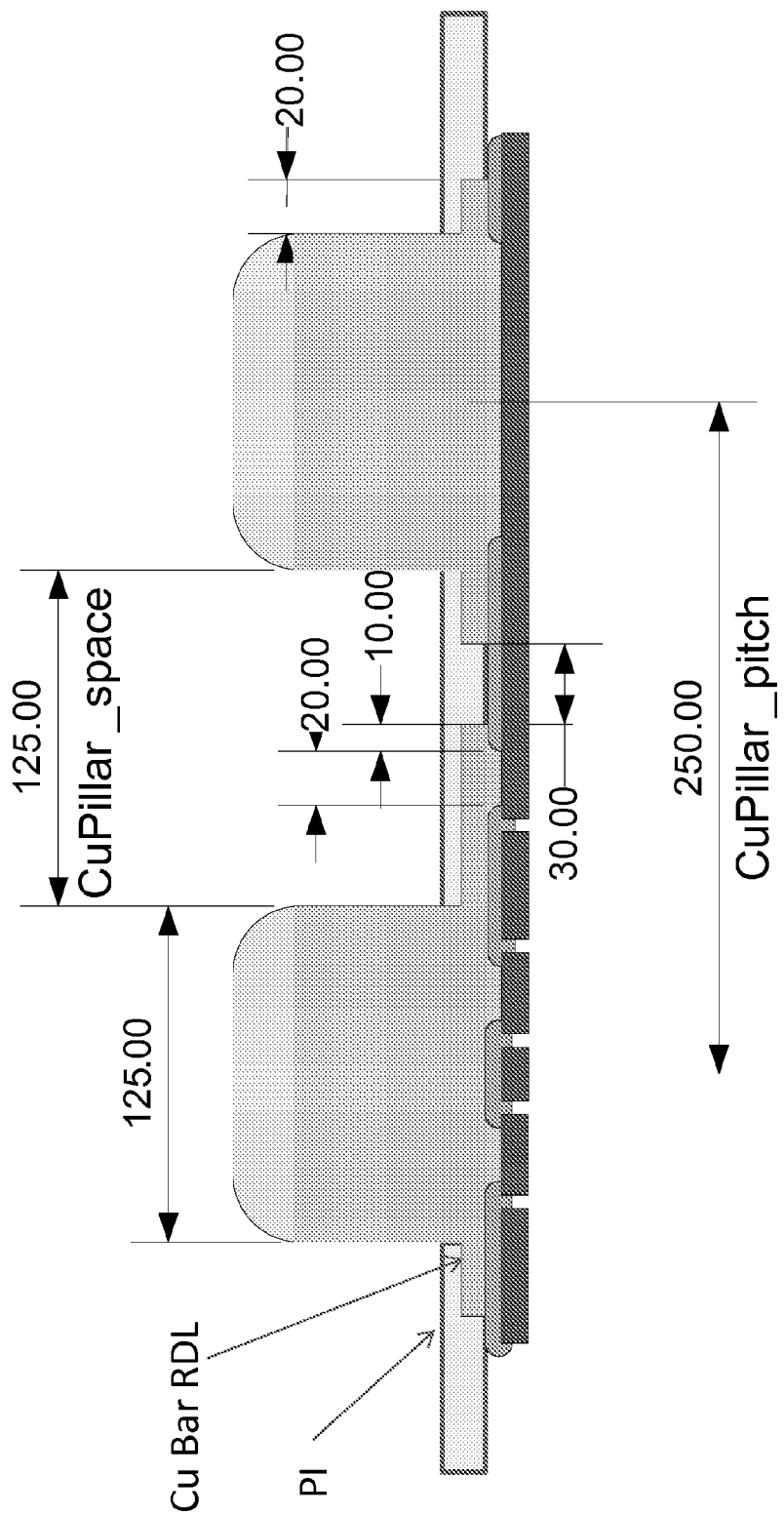

FIGS. 13(a) and 13(b) show a copper pillar structure formed directly on the RDL copper which eliminates process steps including formation of a UBM (because the copper pillar will readily plate on the RDL copper). Formation of a passivation may also be avoided although, as shown in FIG. 13(b), a passivation (i.e., the PI layer) may be formed following pillar formation to inhibit oxidation and any related issues.

Figure 13C:
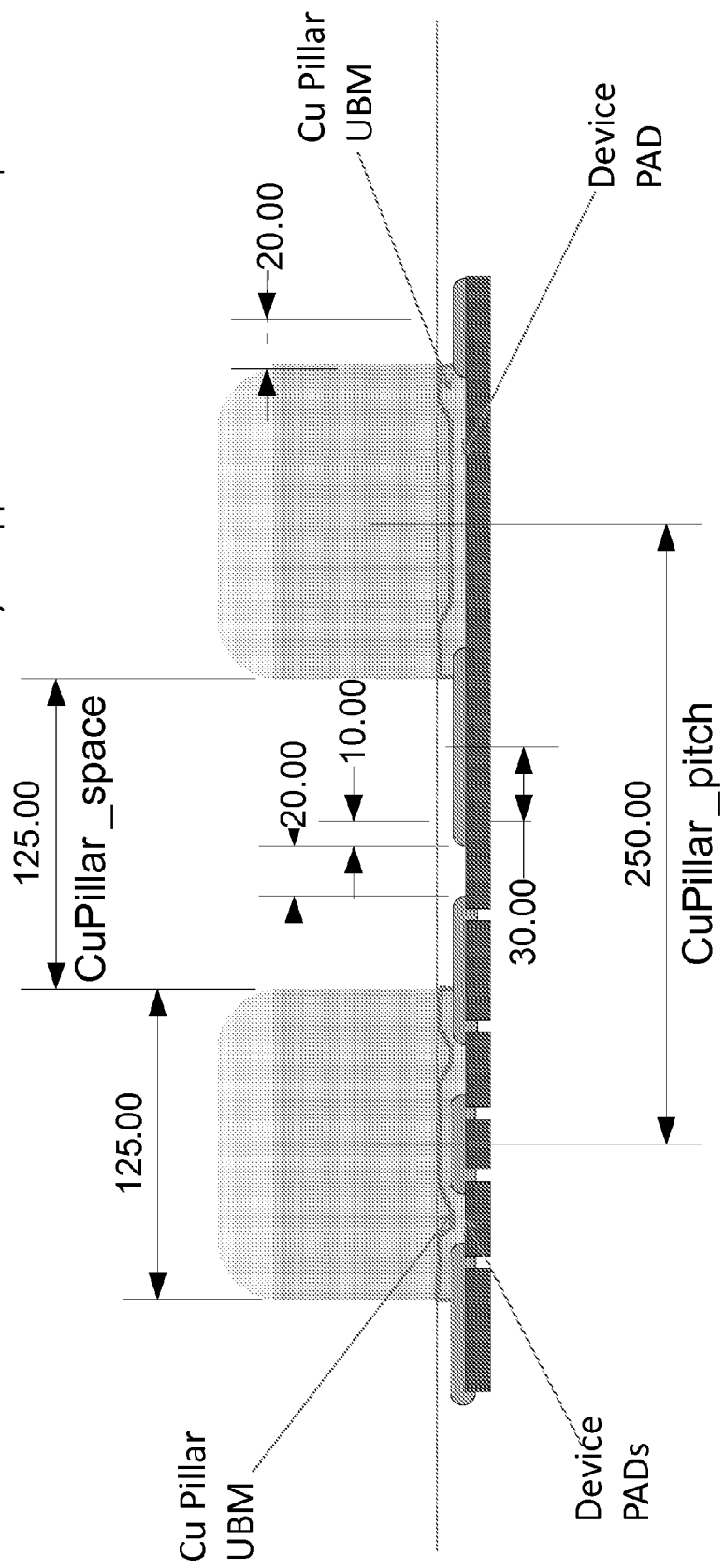

FIG. 13(c) shows the copper pillar structure formed directly on the pad opening to the top metal layer of the device, but without the repassivation layer required in conventional techniques (see, for example, PI of FIG. 12), and without the RDL copper shown in other embodiments. Elimination of the RDL may be feasible, for example, in implementations in which the Rdson for the device is sufficiently low, e.g., the implementation illustrated in FIG. 5. As will be appreciated, formation of the pillar directly on the pad opening allows exploitation of the entire pad opening for formation of the pillar without any encroachment of a passivation. In the depicted embodiment, a UBM is shown as it may be necessary to promote adhesion of the pillar structure to the top metal layer of the device. However, embodiments are contemplated in which a UBM may not be required. As will be understood, a passivation may optionally be applied after pillar formation as shown in FIG. 13(b).

According to a particular process, the structure of FIG. 12 may be fabricated according to the following sequence:
   a. Sputter Ti seed layer
   b. Sputter thin copper seed conductive layer
   c. Place photo resist
   d. Plate patterned copper
   e. Strip photo resist
   f. Strip seed layers using plated copper as a mask
   g. Place polyimide (PI)
   h. Photo expose
   i. Create openings
   j. Cure PI
   k. Sputter Ti seed
   l. Sputter Cu conductive seed
   m. Place photoresist
   n. Plate pattern copper pillar
   o. Plate solder
   p. Strip photoresist
   q. Etch seed The presence of thick copper in above reduces the requirement for thick copper on the bottom so one can make copper thinner (3 um instead of 12 um) and still get great electrical benefits as the copper is shunting an inner metal layer that is typically not thicker than 1 um.

In an alternate process flow that may be used to fabricate the structure of FIG. 13(a), several steps are eliminated because the final package is molded. The elimination of these steps (g–l of the process flow described above) results in the following flow:
   a. Sputter Ti seed layer
   b. Sputter thin copper seed conductive layer
   c. Place first photoresist
   d. Plate patterned copper
   e. Place second photoresist of dry mask
   f. Plate copper pillars
   g. Plate solder
   h. Strip both photoresists
   i. Etch single seed As will be appreciated, this approach eliminates a significant number of processing steps relative to the earlier-described flow, thereby reducing cost. Conductive traces in premolded substrates may be made more conductive using copper pillars implemented as described in the flows above, or using solder bar structures as described in U.S. patent application Ser. No. 12/844,649 for Wafer-Level Chip Scale Package filed Jul. 27, 2010, the entire disclosure of which is incorporated herein by reference for all purposes. The copper is in series with traces and thus serves to effectively reduce lateral conductivity of traces. The RDL routing under the copper pillars may be implemented as described in U.S. patent application Ser. No. 12/343,372 for Flip Chip Power Switch With Under Bump Metallization Stack filed Dec. 23, 2008, the entire disclosure of which is incorporated herein by reference for all purposes. The on-die connections between interdigitated rows of different power rails may be implemented as described in U.S. patent application Ser. No. 12/343,261 for Conductive Routings in Integrated Circuits Using Under Bump Metallization filed Dec. 23, 2008, the entire disclosure of which is incorporated herein by reference for all purposes.

Figure 14:
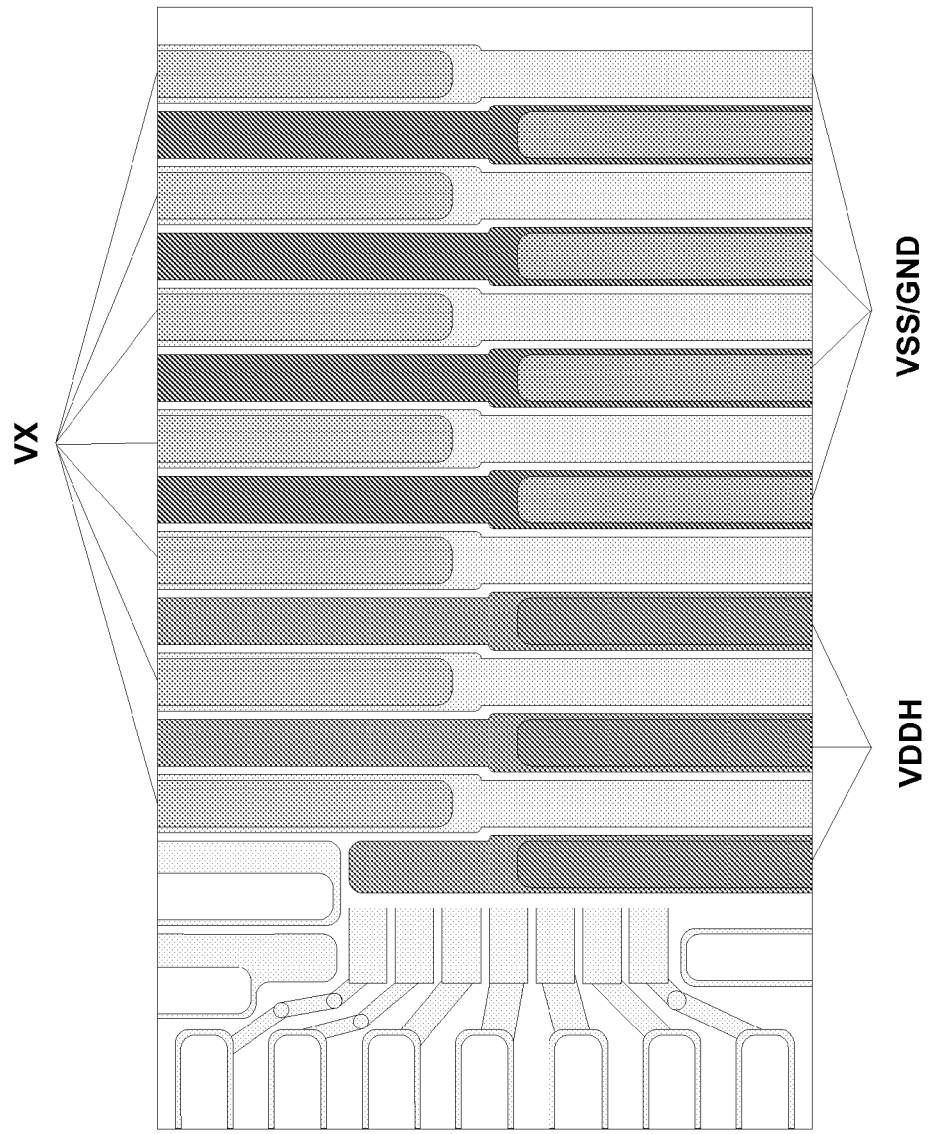
FIGS. 14 and 15 illustrate particular arrangements of conductive elements of particular implementations of interconnect substrates.

It should be noted that premolded substrates fabricated in accordance with various embodiments may be implemented with a wide variety of configurations appropriate for particular applications. For example, some embodiments described herein have relatively unbalanced configurations in terms of the conductive traces in the premolded substrate devoted to respective ones of the terminals of a switching voltage regulator. See, for example, FIGS. 1-5 in which the conductive traces corresponding to VSS/GND significantly outnumber those devoted to Vin (VDDH). This is due to the fact that these designs are intended for low duty cycle applications in which the conduction time of the regulator's low-side switch is large compared to that of the high-side switch. However, premolded substrates may be fabricated in accordance with embodiments of the invention for use with more balanced configurations in which the duty cycle is much larger. One such floor plan configuration is shown in FIG. 14 in which the respective numbers of VDDH and VSS/GND traces are more balanced. Other examples of more balanced configurations with which premolded substrates may be employed are described in U.S. patent application Ser. No. 12/344,134 for Lead Assembly for a Flip-Chip Power Switch, referred to and incorporated herein by reference above. See, for example, FIGS. 9 and 10 of that application. Further examples of more balanced floor plans for which premolded substrates may be constructed are provided in U.S. Pat. No. 6,278,264 referred to and incorporated herein by reference above. See, for example, FIGS. 3 and 8A-8G of that patent. In addition, further embodiments are contemplated in which the conduction time of the high-side switch is longer than that of the low-side switch. Therefore, the scope of the invention should not be limited with reference to particular configurations disclosed herein.

Figure 15:
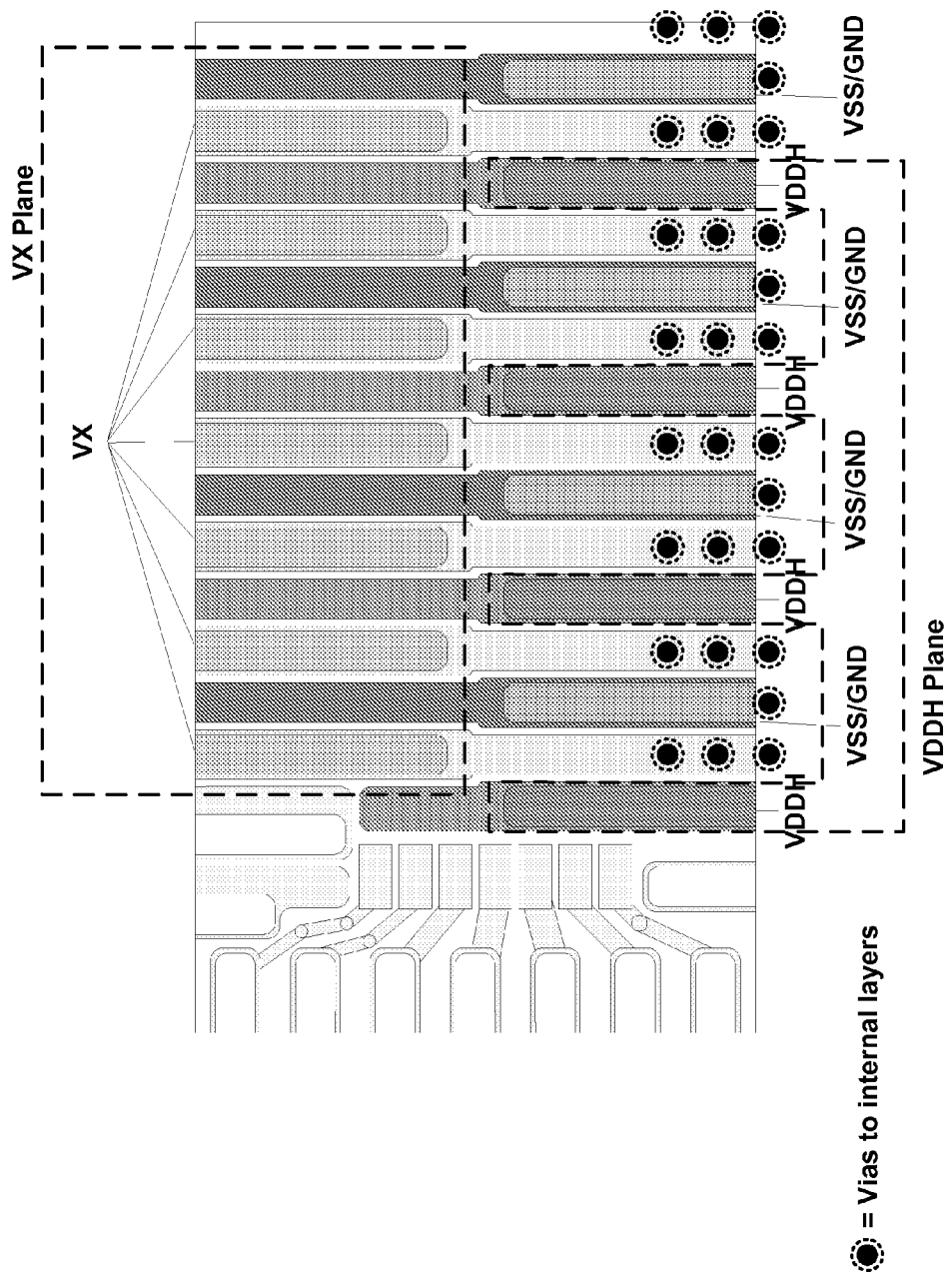

FIG. 15 illustrates yet another floor plan with which a premolded substrate designed in accordance with an embodiment of the invention may be used which includes alternating rows of conductive traces in the pattern VDDH/VX/GND/VX. The VX conductive traces connect with a full VX plane on one side of the underlying PCB. The VDDH conductive traces connect with a VDDH plane on the other side of the PCB shaped as shown. Vias are used to reach internal layers of the PCB. One advantage of the configuration depicted in FIG. 15 is zero "current commutation loss." That is, the same current always flows through the VX traces whether the high-side switch or the low-side switch is conducting and does not change when the conduction is commutated from one to the other. This is to be contrasted with other designs in which current must "redistribute" through the VX traces which, in the presence of stray inductance, causes a delayed turn-on time for some portions of the switches, yielding higher resistance and corresponding loss.

While the invention has been particularly shown and described with reference to specific embodiments thereof, it will be understood by those skilled in the art that changes in the form and details of the disclosed embodiments may be made without departing from the spirit or scope of the invention. For example, the various structures and techniques described herein may be compatible with a variety of packaging technologies and substrate structures, and the scope of protection should therefore not be limited by reference to specific technologies or structures. Examples of other technologies and structures with which various embodiments of the invention may be practiced include, but are not limited to, ALOX substrate technology from MCL Ltd. of Israel, xLC substrate technology from EoPlex Technologies, Inc. of Redwood City, Calif., DreamPAK substrate technology from ASM Pacific Technology Ltd. of the Cayman Islands, Hi-Density Leadframe Array (HLA) technology from United Test and Assembly Center Ltd. (UTAC) of Singapore, and thermal leadless array (TLA) technology from ASAT Ltd. of Dongguan, China (now owned by UTAC's parent Global A&T Electronics Ltd. of Hong Kong).

Finally, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A package, comprising:
   a device including one or more power devices configured as part of a switching regulator, the switching regulator having a power node terminal and a switching terminal; and
   a premolded interconnect substrate for connecting the device to an assembly, the premolded interconnect substrate including a plurality of electrically conductive structures, a first subset of the electrically conductive structures corresponding to the power node terminal, a second subset of the electrically conductive structures corresponding to the switching terminal;
   wherein the device is mounted on exposed portions of the electrically conductive structures adjacent a first surface of the interconnect substrate via conductive bumps thereby connecting the first subset of the electrically conductive structures to the power node terminal and the second subset of the electrically conductive structures to the switching terminal, and wherein exposed portions of the first and second subsets of the electrically conductive structures at a second surface of the interconnect substrate that is opposite the first surface of the interconnect substrate are configured for connection to first and second conductive planes of the assembly, respectively, such that connections between the first subset of electrically conductive structures and the first conductive plane are made along a portion of the second surface of the interconnect substrate proximate a first edge of the interconnect substrate, and connections between the second subset of electrically conductive structures and the second conductive plane are made along a second portion of the second surface proximate a second edge of the interconnect substrate opposing the first edge.

2. The package of claim 1 wherein the one or more power devices comprise two power devices, and wherein the switching regulator includes two power node terminals and the switching terminal.

3. The package of claim 1 wherein at least one of the electrically conductive structures is enclosed in the interconnect substrate by at least one other of the electrically conductive structures.

4. The package of claim 1 wherein the device includes control circuitry associated with the one or more power devices, and wherein some of the electrically conductive structures correspond to control circuit nodes of the control circuitry.

5. The package of claim 1 wherein at least some of the electrically conductive structures of the interconnect substrate have discrete passive circuit elements connected thereto.

6. The package of claim 5 wherein the discrete passive circuit elements include a plurality of capacitors connected to the terminals of the switching regulator.

7. The package of claim 6 wherein the power node terminal or the switching terminal has two or more of the plurality of capacitors connected thereto, the two or more capacitors being mounted on the interconnect substrate along more than one edge of the device.

8. The package of claim 6 wherein one or more of the capacitors corresponding to the power node terminal are mounted along the second edge of the interconnect substrate.

9. The package of claim 5 wherein the electrically conductive structures to which a first one of the discrete passive elements is connected are configured for indirect connection to the assembly via internal routing of the interconnect substrate.

10. The package of claim 5 wherein one or more of the discrete passive circuit elements are mounted on the interconnect substrate between adjacent ones of the conductive bumps.

11. The package of claim 1 further comprising an underfill material occupying space between the conductive bumps connecting the electrically conductive structures of the interconnect substrate to the device.

12. The package of claim 11 wherein the underfill material comprises either a dispensed underfill or a molded underfill.

13. The package of claim 11 wherein the underfill material is part of an encapsulation material at least partially encapsulating the device.

14. The package of claim 1 wherein the device is mounted on the electrically conductive structures of the interconnect substrate on a first side of the device, and wherein a second side of the device opposing the first side is exposed for heat removal.

15. The package of claim 14 wherein the interconnect substrate includes a thermally conductive structure, the package further comprising a heat spreader structure mounted on the exposed second side of the device and thermally connected to the thermally conductive structure of the interconnect substrate to promote heat conduction from the device to the thermally conductive structure.

16. The package of claim 15 wherein at least a portion of the thermally conductive structure extends through the interconnect substrate and is configured for connection to the assembly, thereby enabling conduction of the heat from the device to the assembly.

17. The package of claim 15 further comprising one or more portions of a carrier frame disposed along one or more edges of the interconnect substrate adjacent the device, the heat spreader structure being thermally connected to the thermally conductive structure of the interconnect substrate via the portions of the carrier frame.

18. The package of claim 15 wherein the heat spreader structure comprises a plurality of disconnected or partially connected portions, and/or one or more apertures.

19. The package of claim 1 further comprising:
   a second device; and
   a second interconnect substrate for connecting the second device to the assembly via the interconnect substrate, the second interconnect substrate including a second plurality of electrically conductive structures;

wherein the second device is mounted on exposed portions of the second plurality of electrically conductive structures via second conductive bumps, and wherein the second interconnect substrate is mounted on the device with at least some of the second plurality of electrically conductive structures being connected to one or more of the plurality of electrically conductive structures of the interconnect substrate via third conductive bumps adjacent an edge of the device.

* * * * *